(12) United States Patent
Cosgrove et al.

(10) Patent No.: US 11,453,193 B2
(45) Date of Patent: Sep. 27, 2022

(54) CURVATURE LIMITING FILM

(71) Applicant: 3M INNOVATIVE PROPERTIES COMPANY, St. Paul, MN (US)

(72) Inventors: Dylan T. Cosgrove, Oakdale, MN (US); Fay T. Salmon, Eden Prairie, MN (US); Michael R. Gorman, Woodbury, MN (US); Alex P. Beane, Burnsville, MN (US); Scott M. Niemi, St. Paul, MN (US); Vincent Jusuf, Minneapolis, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 216 days.

(21) Appl. No.: 16/622,990

(22) PCT Filed: Jul. 16, 2018

(86) PCT No.: PCT/US2018/042208
§ 371 (c)(1),
(2) Date: Dec. 16, 2019

(87) PCT Pub. No.: WO2019/018251
PCT Pub. Date: Jan. 24, 2019

(65) Prior Publication Data
US 2021/0146648 A1      May 20, 2021

Related U.S. Application Data

(60) Provisional application No. 62/585,963, filed on Nov. 14, 2017, provisional application No. 62/540,892, (Continued)

(51) Int. Cl.
*B32B 3/18*     (2006.01)
*B32B 3/22*     (2006.01)
(Continued)

(52) U.S. Cl.
CPC .................. *B32B 3/18* (2013.01); *B32B 3/22* (2013.01); *B32B 3/30* (2013.01); *B32B 7/08* (2013.01);
(Continued)

(58) Field of Classification Search
None
See application file for complete search history.

(56) References Cited

U.S. PATENT DOCUMENTS 3,266,113 A * 8/1966 Flanagan, Jr. ..... A44B 18/0053
24/452
3,557,413 A * 1/1971 Engle ................. A44B 18/0053
24/584.1
(Continued)

FOREIGN PATENT DOCUMENTS

CN        104752622 A  *  7/2015  ............... G06F 1/16
CN        106297568 A  *  1/2017
(Continued)

OTHER PUBLICATIONS

International Search Report for PCT International Application No. PCT/US2018/042208, dated Sep. 27, 2018, 4 pages.

*Primary Examiner* — Jeffrey A Vonch
(74) *Attorney, Agent, or Firm* — Michael J. Stern

(57) ABSTRACT

Various apparatuses are disclosed including those that have curvature arresting properties. According to one example, the apparatus can optionally include a flexible first film, a second film and a first plurality of features. The first plurality of features can be disposed between the first film and the second film At least some of the first plurality of features are spaced apart from one another by a gap when the first film is not subject to an applied bending force or is subject to the applied bending force below a predetermined magnitude in one or both of the transverse direction and the longitudinal direction, and at least some of the first plurality of features
(Continued)

contact one another to arrest a curvature of the first film when the applied bending force is at or above the predetermined magnitude.

16 Claims, 20 Drawing Sheets

Related U.S. Application Data filed on Aug. 3, 2017, provisional application No. 62/540,882, filed on Aug. 3, 2017, provisional application No. 62/533,275, filed on Jul. 17, 2017.

(51) Int. Cl.

| | | |
|---|---|---|
| *B32B 3/30* | (2006.01) | |
| *B32B 7/08* | (2019.01) | |
| *G02F 1/1333* | (2006.01) | |
| *G06F 1/16* | (2006.01) | |
| *H01L 51/00* | (2006.01) | |
| *G09F 9/30* | (2006.01) | |
| *B32B 3/16* | (2006.01) | |
| *B32B 27/32* | (2006.01) | |
| *B32B 27/36* | (2006.01) | |
| *H01L 51/52* | (2006.01) | |
| *B32B 3/06* | (2006.01) | |
| *B32B 3/08* | (2006.01) | |

(52) U.S. Cl.
CPC ...... *G02F 1/133305* (2013.01); *G06F 1/1652* (2013.01); *G09F 9/301* (2013.01); *H01L 51/0097* (2013.01); *B32B 3/06* (2013.01); *B32B 3/08* (2013.01); *B32B 3/085* (2013.01); *B32B 3/16* (2013.01); *B32B 27/32* (2013.01); *B32B 27/365* (2013.01); *B32B 2307/412* (2013.01); *B32B 2307/418* (2013.01); *B32B 2307/50* (2013.01); *B32B 2307/546* (2013.01); *B32B 2457/20* (2013.01); *B32B 2457/206* (2013.01); *B32B 2457/208* (2013.01); *G06F 2203/04102* (2013.01); *H01L 51/5237* (2013.01); *H01L 2251/5338* (2013.01); *H05K 2201/05* (2013.01); *H05K 2201/10128* (2013.01); *H05K 2201/2009* (2013.01); *Y10T 428/24025* (2015.01); *Y10T 428/24033* (2015.01); *Y10T 428/2457* (2015.01); *Y10T 428/24562* (2015.01)

(56) References Cited

U.S. PATENT DOCUMENTS

| | | | | |
|---|---|---|---|---|
| 3,586,220 A * | 6/1971 | Reinsberg | ............ | A44C 5/0015 24/584.1 |
| 3,829,938 A * | 8/1974 | Ballin | ............ | A44B 99/00 24/DIG. 40 |
| 3,920,339 A | 11/1975 | Fletcher | | |
| 5,077,870 A | 1/1992 | Melbye | | |
| 5,119,531 A * | 6/1992 | Berger | ............ | A44B 18/0092 24/DIG. 39 |
| 5,235,731 A * | 8/1993 | Anzai | ............ | A44B 18/0053 24/DIG. 39 |
| 5,396,687 A * | 3/1995 | Osterman | ............ | A44B 18/0065 24/449 |
| 5,398,387 A * | 3/1995 | Torigoe | ............ | A44B 18/0053 24/452 |
| 5,579,562 A * | 12/1996 | Hattori | ............ | F16B 5/07 24/442 |
| 5,664,301 A * | 9/1997 | Akeno | ............ | A44B 18/0061 24/442 |
| 5,845,375 A | 12/1998 | Miller | | |
| 5,868,987 A | 2/1999 | Kampfer | | |
| 5,983,467 A * | 11/1999 | Duffy | ............ | A61F 13/622 24/584.1 |
| 6,167,597 B1 * | 1/2001 | Malin | ............ | B65D 33/2541 24/399 |
| 6,357,128 B1 | 3/2002 | Iden | | |
| 6,367,128 B1 * | 4/2002 | Galkiewicz | ............ | A44B 18/0053 24/572.1 |
| 6,546,604 B2 | 4/2003 | Galkiewicz | | |
| 6,588,074 B2 | 7/2003 | Galkiewicz | | |
| 7,984,569 B2 | 7/2011 | Chaney | | |
| 8,237,165 B2 | 8/2012 | Kim | | |
| 10,212,811 B1 * | 2/2019 | Zhang | ............ | H01L 51/0097 |
| 10,590,973 B2 * | 3/2020 | Cosgrove | ............ | G09F 9/301 |
| 2001/0018785 A1 * | 9/2001 | Galkievicz | ............ | A44B 18/0053 24/605 |
| 2002/0069495 A1 * | 6/2002 | Murasaki | ............ | A44B 18/0053 24/442 |
| 2004/0170341 A1 * | 9/2004 | Galkiewicz | ............ | A44B 18/0053 384/7 |
| 2004/0170342 A1 * | 9/2004 | Galkiewicz | ............ | A44B 18/0053 384/42 |
| 2004/0183958 A1 * | 9/2004 | Akiyama | ............ | G09F 9/30 349/58 |
| 2007/0158376 A1 | 7/2007 | Radley-Smith | | |
| 2008/0018631 A1 * | 1/2008 | Hioki | ............ | G02F 1/133526 345/206 |
| 2008/0042940 A1 * | 2/2008 | Hasegawa | ............ | H01L 27/3281 345/55 |
| 2008/0055831 A1 * | 3/2008 | Satoh | ............ | H05K 1/0281 361/600 |
| 2010/0220496 A1 * | 9/2010 | Kim | ............ | G02F 1/13452 445/24 |
| 2010/0238612 A1 * | 9/2010 | Hsiao | ............ | H05K 1/189 361/679.01 |
| 2010/0308335 A1 | 12/2010 | Kim | | |
| 2012/0212433 A1 * | 8/2012 | Lee | ............ | G06F 1/1643 345/173 |
| 2012/0307423 A1 * | 12/2012 | Bohn | ............ | H04M 1/0216 361/679.01 |
| 2013/0091667 A1 * | 4/2013 | Zerfas | ............ | A44B 18/008 24/449 |
| 2013/0260101 A1 * | 10/2013 | Hong | ............ | H05K 1/0281 428/188 |
| 2013/0318752 A1 * | 12/2013 | Kheil | ............ | A44B 18/0084 24/585.12 |
| 2014/0099479 A1 * | 4/2014 | Krall | ............ | G09F 9/33 428/174 |
| 2014/0111954 A1 | 4/2014 | Lee | | |
| 2014/0123436 A1 * | 5/2014 | Griffin | ............ | G06F 1/1681 16/221 |
| 2014/0226275 A1 * | 8/2014 | Ko | ............ | G06F 1/1681 361/679.27 |
| 2014/0295150 A1 * | 10/2014 | Bower | ............ | B32B 15/085 428/201 |
| 2015/0055287 A1 * | 2/2015 | Seo | ............ | H04M 1/0216 361/679.27 |
| 2015/0104632 A1 * | 4/2015 | Dyllong | ............ | B64C 3/26 428/223 |
| 2015/0109544 A1 * | 4/2015 | Yeo | ............ | G02F 1/133305 349/12 |
| 2015/0131222 A1 * | 5/2015 | Kauhaniemi | ............ | G06F 1/1652 16/225 |
| 2015/0176317 A1 * | 6/2015 | Lee | ............ | G06F 1/1681 16/251 |
| 2015/0195936 A1 * | 7/2015 | Park | ............ | G06F 1/1652 428/161 |
| 2015/0241925 A1 * | 8/2015 | Seo | ............ | G06F 1/1681 361/679.27 |
| 2015/0258939 A1 * | 9/2015 | Hipshier | ............ | B60R 7/04 160/229.1 |
| 2015/0370287 A1 * | 12/2015 | Ko | ............ | G06F 1/1679 361/749 |
| 2015/0378391 A1 * | 12/2015 | Huitema | ............ | G06F 1/163 361/679.03 |

(56) References Cited

U.S. PATENT DOCUMENTS

| | | | |
|---|---|---|---|
| 2016/0014883 A1* | 1/2016 | Cho | H01L 51/0097 361/749 |
| 2016/0014914 A1* | 1/2016 | Stroetmann | H05K 5/0021 312/223.1 |
| 2016/0014919 A1* | 1/2016 | Huitema | G06F 1/1652 313/511 |
| 2016/0037625 A1* | 2/2016 | Huitema | H05K 5/0017 361/749 |
| 2016/0085352 A1* | 3/2016 | Kang | G06F 3/0443 345/174 |
| 2016/0118616 A1* | 4/2016 | Hiroki | H01L 51/525 257/40 |
| 2016/0127525 A1* | 5/2016 | Lee | G06F 1/1652 455/575.1 |
| 2016/0139634 A1* | 5/2016 | Cho | G06F 1/1652 16/366 |
| 2016/0184041 A1* | 6/2016 | Gafford | A61B 34/72 606/174 |
| 2016/0195901 A1* | 7/2016 | Kauhaniemi | G06F 1/1652 361/679.27 |
| 2016/0198579 A1* | 7/2016 | Hong | G06F 1/1601 248/346.01 |
| 2016/0291642 A1* | 10/2016 | Kwak | H04M 1/0268 |
| 2016/0330828 A1* | 11/2016 | Chu | G02F 1/1339 |
| 2016/0343964 A1* | 11/2016 | Kwon | H01L 51/0097 |
| 2017/0013918 A1* | 1/2017 | Ren | B60N 2/5833 |
| 2017/0142847 A1* | 5/2017 | Park | G06F 1/1681 |
| 2017/0270835 A1* | 9/2017 | Yang | G06F 1/1652 |
| 2017/0285688 A1* | 10/2017 | Sun | G06F 1/1681 |
| 2017/0294151 A1* | 10/2017 | Arai | G06F 3/04883 |
| 2017/0301267 A1* | 10/2017 | Cai | H01L 51/56 |
| 2017/0303414 A1* | 10/2017 | Chu | H05K 5/0226 |
| 2017/0374751 A1* | 12/2017 | Yang | G06F 1/1626 |
| 2018/0020556 A1* | 1/2018 | Seo | G09F 9/301 |
| 2018/0095551 A1* | 4/2018 | Lindblad | H01L 51/52 |
| 2018/0124937 A1* | 5/2018 | Choi | G06F 1/1652 |
| 2018/0135674 A1* | 5/2018 | Cosgrove | H01L 51/0097 |
| 2018/0145269 A1* | 5/2018 | Myeong | G06F 1/1652 |
| 2018/0164852 A1* | 6/2018 | Lim | H04M 1/0237 |
| 2018/0177046 A1* | 6/2018 | Wald | H05K 5/0017 |
| 2018/0190936 A1* | 7/2018 | Lee | B32B 15/04 |
| 2018/0232008 A1* | 8/2018 | Sun | G02F 1/133305 |
| 2018/0290430 A1* | 10/2018 | Liu | G09F 9/30 |
| 2018/0307338 A1* | 10/2018 | Park | G06F 3/041 |
| 2018/0314299 A1* | 11/2018 | Xia | G06F 1/1681 |
| 2018/0348821 A1* | 12/2018 | Hamburgen | G09F 9/301 |
| 2018/0356859 A1* | 12/2018 | Hamburgen | G06F 1/1626 |
| 2019/0157609 A1* | 5/2019 | Suzuki | H01L 51/524 |
| 2019/0221142 A1* | 7/2019 | Tian | G09F 9/301 |
| 2019/0226510 A1* | 7/2019 | Cott | F16B 11/006 |
| 2019/0380217 A1* | 12/2019 | Cosgrove | H05K 3/0058 |
| 2021/0086469 A1* | 3/2021 | Cosgrove | B32B 3/085 |
| 2021/0174709 A1 | 6/2021 | Xiang | |

FOREIGN PATENT DOCUMENTS

| | | | | |
|---|---|---|---|---|
| CN | 106328599 A | * | 1/2017 | H01L 23/14 |
| CN | 106455371 A | * | 2/2017 | H05K 5/0017 |
| JP | 2009170173 A | * | 7/2009 | |
| KR | 2006117180 | | 11/2006 | |
| KR | 2007040699 | | 4/2007 | |
| KR | 2007040699 A | * | 4/2007 | |
| KR | 2014049911 A | * | 4/2014 | G06F 1/16 |
| TW | M541027 U | * | 5/2017 | |
| WO | 20151003331 W | | 7/2015 | |
| WO | 20151004041 W | | 7/2015 | |
| WO | WO 2016-100182 | | 6/2016 | |
| WO | WO 2016-130279 | | 8/2016 | |
| WO | 20161961801 W | | 12/2016 | |
| WO | WO 2016-196180 | | 12/2016 | |
| WO | WO 2016-196181 | | 12/2016 | |
| WO | WO 2016-196736 | | 12/2016 | |

* cited by examiner

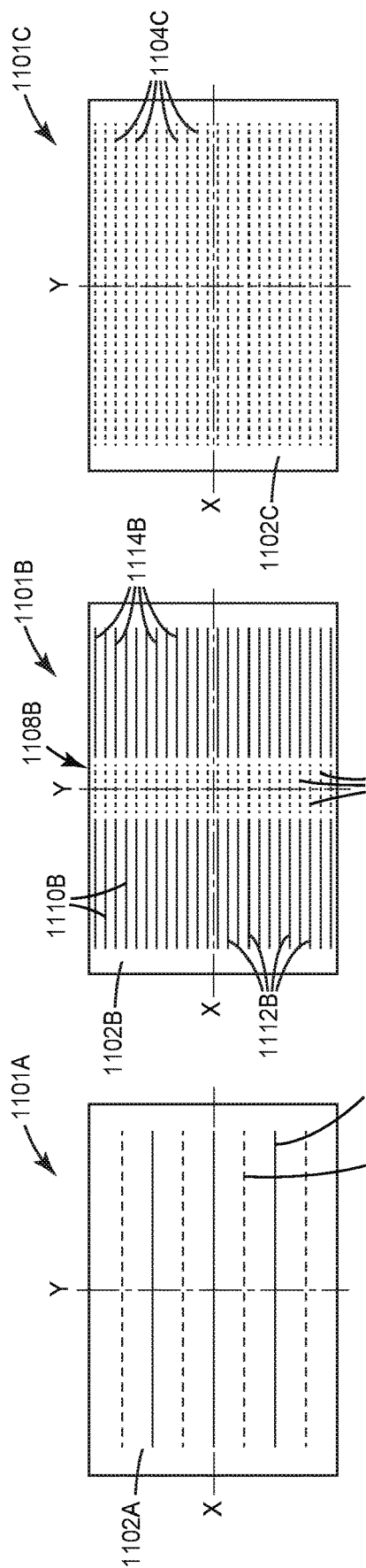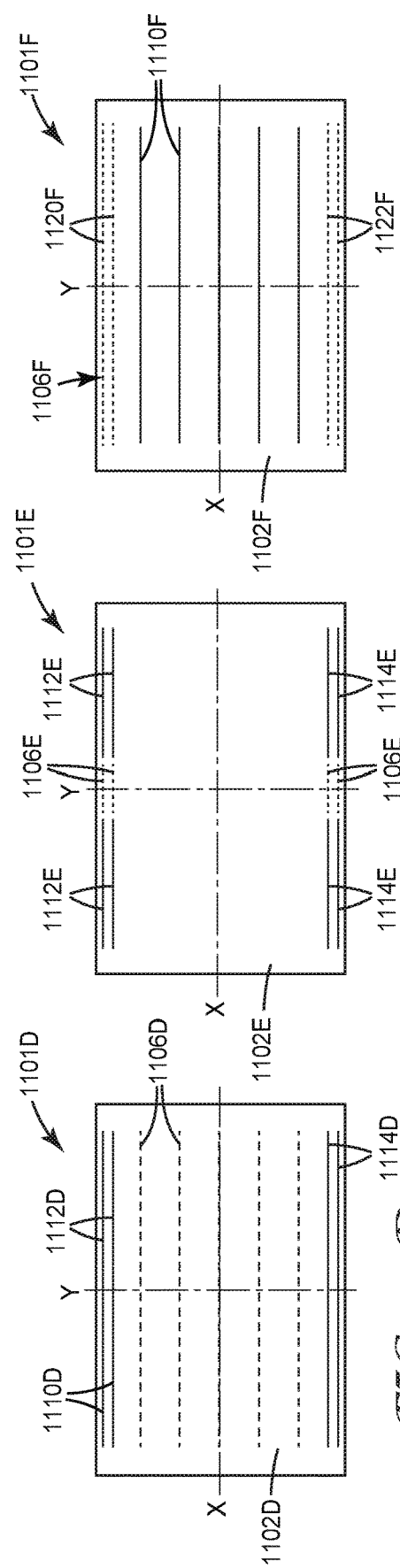

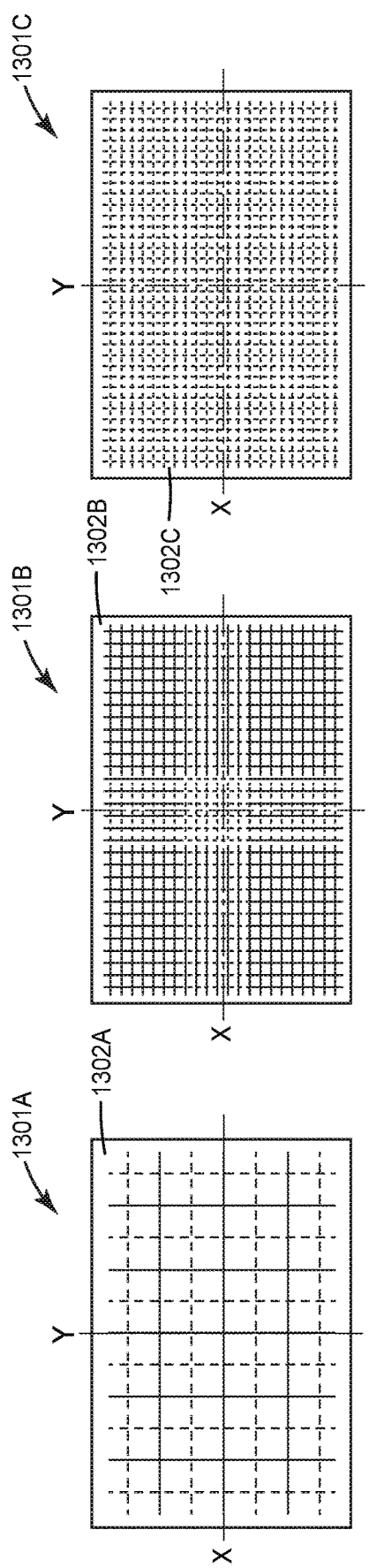
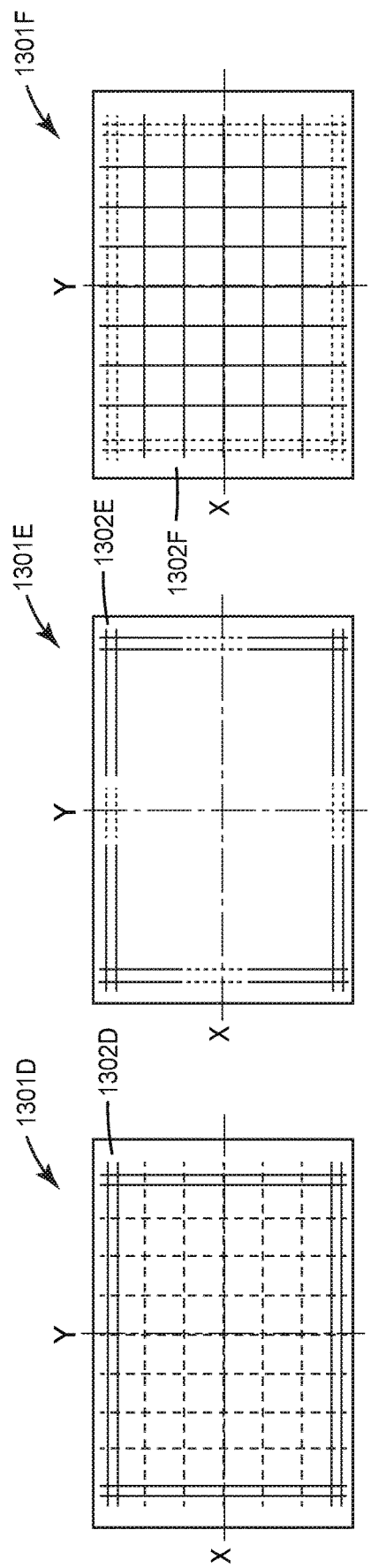

CURVATURE LIMITING FILM

RELATED APPLICATIONS

This application claims priority to U.S. Provisional Application Ser. No. 62/533,275 (entitled CURVATURE LIMITING FILM, filed Jul. 17, 2017) and to U.S. Provisional Application Ser. No. 62/540,892 (entitled CURVATURE LIMITING FILM, filed Aug. 3, 2017, and to U.S. Provisional Application Ser. No. 62/585,963 (entitled CURVATURE LIMITING FILM, filed Nov. 14, 2017) and to U.S. Provisional Application Ser. No. 62/540,882 (entitled CURVATURE LIMITING FILM, filed Aug. 3, 2017) all of which are incorporated herein by reference.

TECHNICAL FIELD

This document pertains generally, but not by way of limitation, to apparatuses such as electronic devices and wearable devices that utilize one or more layers of flexible film. More specifically, without limitation, this document relates to apparatuses with features that arrest a curvature of the one or more layers of flexible film.

BACKGROUND

Regarding electronic devices, the development of organic light-emitting diodes (OLED) and active-matrix organic light-emitting diodes (AMOLED) that can be fabricated on a flexible substrate has enabled flexible displays. In some cases, these flexible displays may be folded or bent. However, the conformability of the layers used for such substrate is limited. Additionally, shear strain between layers on the display can cause debonding. Creasing of the substrate is also a concern.

SUMMARY

The present inventors have recognized, among other things, that a variety of apparatuses can benefit from a rigidifying layer that arrest a curvature of the one or more layers of flexible film. According to some embodiments, the rigidifying layer can be comprised of a plurality of features as will be discussed subsequently. Such apparatuses can include electronic devices and wearable devices. In regards to electronic devices, these can include phones, displays, batteries, for example. The apparatuses can be used with various types of displays including multiple semi-rigid, rigid liquid crystal or LED displays, flexible OLED/AMOLED/LCD displays or the like. Wearable devices can include not only the displays and batteries discussed above but can also include athletic equipment protective braces, medical braces, or medical devices, for example.

At least some portions of the present disclosure are directed to various apparatuses with curvature arresting properties. According to one embodiment, the apparatus can optionally include a flexible first film, a second film and a first plurality of features. The flexible first film can have an extent in both a longitudinal direction and a transverse direction. The second film can at least partially interface the first film and can have an extent in both the longitudinal and the transverse direction. The first plurality of features can be disposed between the first film and the second film and can optionally have an extent in both the transverse direction and the longitudinal direction. The first plurality of features can include at least some adjacent ones of the first plurality of features having a gap among one another when the first film is not subject to an applied bending force or is subject to the applied bending force below a predetermined magnitude in one or both of the transverse direction and the longitudinal direction, and at least some adjacent ones of the first plurality of features contact one another to arrest a curvature of the first film in one or both of the transverse direction and the longitudinal direction when the applied bending force is at or above the predetermined magnitude. The second film can be moveable relative to the first film in at least one of the longitudinal direction or transverse direction.

According to some aspects and embodiments of the present disclosure, the apparatus can include the first plurality of features comprise one or more of a curvature arresting feature and an interlocking device. The interlocking device can comprise one or more of rails, channels, caps and stems. The first plurality of features can comprise one or more of thermoplastic or thermosetting polymers, polymer composites, metals or ceramics. The first plurality of features can be arranged in a geometric pattern. The first plurality of features can have substantially a same size. The gap comprises 0.050 mm to 10 mm, inclusive. The gap has a first ratio of a width to that of one of the first plurality of features between 0.1 and 10, inclusive, and wherein the gap has a second ratio to that of a thickness of the one of the first plurality of features between 0.1 and 1, inclusive. The first plurality of features are attached to or integrated with the first film. The plurality of features have one of a substantially trapezoidal shape in cross-section or a chamfered rectangular shape in cross-section. At least two of the first plurality of features can include both a major surface and a side surface that extends from the major surface to the surface of the first film, and wherein the side surface of the first of the at least two of the first plurality of features can be configured to engage the side surface of the second of the at least two of the first plurality of features to arrest the curvature of the first film. One or more of the first plurality of features can have one of a shape or orientation to provide for a desired degree of curvature for the first film. At least some of the first plurality of features can be configured to interlock with others of the at least some of the first plurality of features during the curvature of the first film to maintain the curvature of the first film at a desired degree in an absence of the applied bending force.

According to further aspects and embodiments, the apparatus can further include a second plurality of interlocking devices attached to or integral with the second film, and one or more of the first plurality of features comprise a first plurality of interlocking devices that can be configured to engage the second plurality of interlocking devices. When the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible. Separation of the first film from the second film in a direction generally perpendicular to the surface of the first film can be prevented by engagement of the first plurality of interlocking devices with the second plurality of interlocking devices. The second plurality of interlocking devices can project from a surface of the second film. The second plurality of interlocking devices can have an extent in both the transverse direction and the longitudinal direction, and at least some adjacent ones of the second plurality of interlocking devices having a second gap among one another when the second film is not subject to the applied bending force or is subject to the applied bending force below the predetermined magnitude in one or both of the transverse direction and the longitudinal direction. At least some adjacent ones of the second plurality of interlocking features contact one another and/or the first plurality of features to arrest a curvature of the second film in one or both of the transverse direction and the longitudinal direction when the applied bending force is at or above the predetermined magnitude. Engagement of the first plurality of interlocking devices with the second plurality of interlocking devices can be facilitated by an initial movement of the first film relative to the second film in one of the transverse direction and the longitudinal direction, and disengagement of the first plurality of interlocking devices from the second plurality of interlocking devices can be facilitated by a sequent movement of the first film relative to the second film in a same one of the transverse direction and the longitudinal direction. The first plurality of interlocking devices and the second interlocking devices can comprise engagement rails that form a sliding channel.

According to further aspects and embodiments, the apparatus can further include a first plurality of interlocking devices attached to or integral with the first film and spaced from the first plurality of features in at least one of the transverse direction and the longitudinal direction, a second plurality of interlocking devices attached to or integral with the second film, and the first plurality of interlocking devices are configured to engage the second plurality of interlocking devices, and when the first plurality of interlocking devices engage the second plurality of interlocking devices, movement of the first film from the second film in one of the transverse direction and the longitudinal direction can be prevented while movement of the first film relative to the second film in the other of the transverse direction and the longitudinal direction is possible. Separation of the first film from the second film in a direction generally perpendicular to the surface of the first film can be prevented by engagement of the first plurality of interlocking devices with the second plurality of interlocking devices. A second plurality of features can project from a surface of the second film. The second plurality of features can have an extent in both the transverse direction and the longitudinal direction, and at least some adjacent ones of the second plurality of features can be have a second gap among one another when the second film is not subject to the applied bending force or is subject to the applied bending force below the predetermined magnitude in one or both of the transverse direction and the longitudinal direction. The at least some adjacent ones of the second plurality of features can contact one another and/or the first plurality of features to arrest a curvature of the first film in one or both of the transverse direction and the longitudinal direction when the applied bending force is at or above the predetermined magnitude. Engagement of the first plurality of interlocking devices with the second plurality of interlocking devices can be facilitated by an initial movement of the first film relative to the second film in one of the transverse direction and the longitudinal direction. Disengagement of the first plurality of interlocking devices with the second plurality of interlocking devices can be facilitated by a sequent movement of the first film relative to the second film in a same one of the transverse direction and the longitudinal direction. The first plurality of interlocking devices and the second interlocking devices can comprise engagement rails that form a sliding channel.

According to further aspects and embodiments, the apparatus can include an optical coupler disposed between the first film and the second film, wherein the optical coupler is a liquid, adhesive, gel, or a combination thereof. The optical coupler can have a refractive index having an absolute difference less than or equal to 0.05 from a refractive index of the first plurality of features. The apparatus can comprise a part of an electronic device and/or a wearable device. The first plurality of features can be configured to provide the apparatus with a first stiffness at a desired degree of curvature in one of the transverse direction and the longitudinal direction, while being configured to provide the apparatus with a second stiffness at the same desired degree of curvature in the other of the transverse direction and the longitudinal direction, and wherein the first stiffness differs from the second stiffness.

The first plurality of features can be optically clear. One or both of the first film and the second film can comprise at least one of a single layer or a plurality of layers. The second film can comprise a rigid component. The second film can comprise a different material than the first film. The first plurality of features can be disposed on both a first major surface of the first film and a second major surface of the first film.

This summary is intended to provide an overview of subject matter of the present patent application. It is not intended to provide an exclusive or exhaustive explanation of the invention.

The detailed description is included to provide further information about the present patent application.

BRIEF DESCRIPTION OF DRAWINGS

FIGS. 17A to 19F show various embodiments of apparatuses using various arrangements of curvature arresting features and/or interlocking devices.

Figure 1:
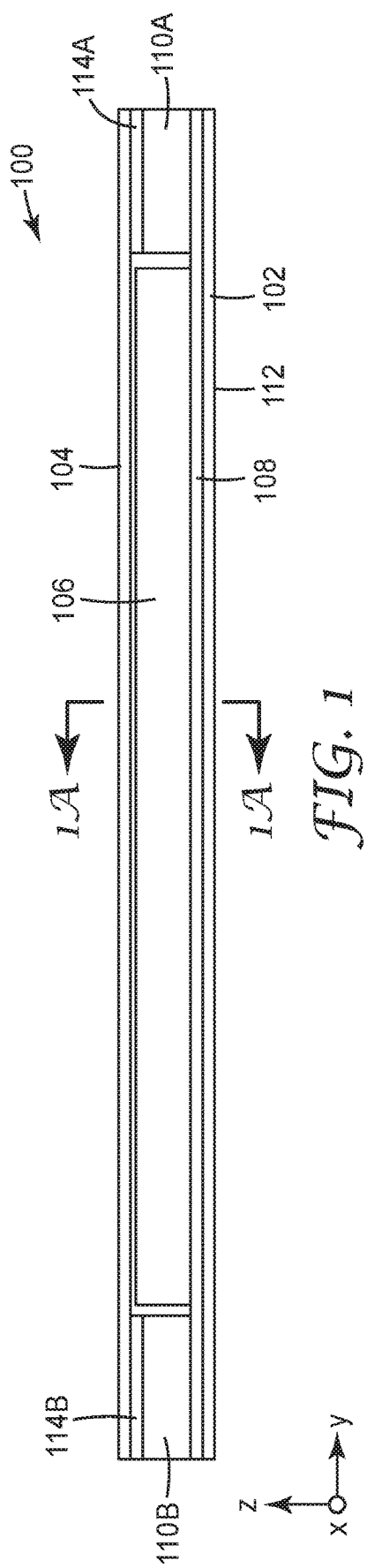
FIG. 1 is a plan view of an end of a first apparatus according to one embodiment having a plurality of components including a first film and curvature arresting features according to one embodiment of the present disclosure.

The accompanying drawings are incorporated in and constitute a part of this specification and, together with the description, explain the advantages and principles of the invention. In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

In recent years, among next-generation displays, electronic devices that can be curved, bent, or folded have received increasing attention as a way to provide new user experiences. These device architectures include flexible OLEDs, plastic LCDs, fuel cells, flexible batteries, flow batteries, and the like. Typically the flexible or foldable component layer is immediately adjacent to a rigid member to provide mechanical stiffness in use. As an example, the rigid member may also be a part of the heat sink, battery, electromagnetic shielding, or other components for a display panel.

Usually the boundary condition between such a flexible component layer and such a rigid member can affect both the aesthetics of the device as well as its fatigue performance over thousands of cycles since fatigue life is generally inversely proportional to the maximum strain in a given folding or bending cycle. Fatigue occurs when an object is subjected to repeated loading and unloading (e.g., folding and unfolding) and fatigue life is often a function of the magnitude of the fluctuating stress, object physical properties, geometry of the object and test conditions. As discussed above, debonding and/or creasing of the substrates used in next-generation displays are also a concern and may affect the functionality and user experience of the device.

The present disclosure generally relates to apparatuses with curvature limiting features that provide the apparatuses with sufficient stiffness after a desired degree of curvature is achieved to stop the apparatus from bending further. This property can protect strain sensitive layers within the electronic and/or wearable device such as the electrical backplane from exceeding a critical strain, which can damage the device. Additionally, improved stiffness as provided by the apparatuses can improve fatigue performance and reduce the likelihood of debonding and/or creasing.

Figure 1A:
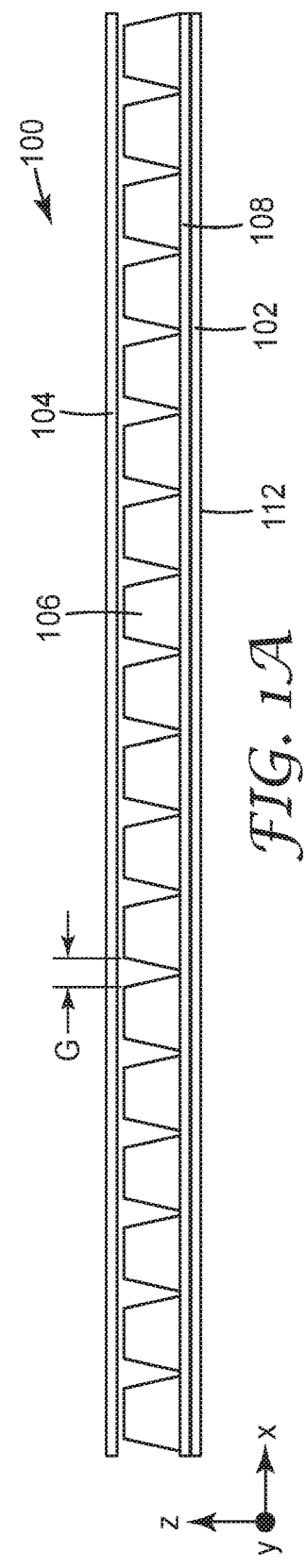
FIG. 1A is a cross-sectional view along A-A of the apparatus of FIG. 1.

FIGS. 1 and 1A show a first apparatus 100 according to one embodiment. The first apparatus 100 can be part of a bonding layer of a wearable device and/or electronic device, for example. The first apparatus 100 can include a first film 102, a second film 104, a plurality of curvature arresting features 106, an adhesive 108, and interlocking devices 110A and 110B (FIG. 1 only).

As shown in FIGS. 1 and 1A the first film 102 can comprise a layer having a relatively larger extent in plan direction relative to a thickness. For example, the first film 102 can have an extent in both a longitudinal direction (i.e. a down web direction) and a transverse direction (i.e. a cross-web direction). In FIGS. 1 and 1A, the longitudinal direction corresponds to an x-axis direction and the transverse direction corresponds to a y-axis direction. The second film 104 can be disposed to at least partially interface with the first film 102. Similar to the first film 102, the second film 104 can comprise a layer. The second film 104 can have an extent in both the longitudinal direction and the transverse direction. The extent of the second film 104 can differ from or be the same as the extent of the first film 102.

The plurality of curvature arresting features can be part of a rigidifying layer that can be disposed between and/or coupled to the first film 102 and the second film 104 to provide curvature arrest for the apparatus 100. The plurality of curvature arresting features 106 (only one is shown in the plan view of FIG. 1) can be disposed between the first film 102 and the second film 104. In some embodiments, the plurality of curvature arresting features 106 are attached to first film 102, for example, via the adhesive 108. Thus, the adhesive 108 can be disposed between the first film 102 and the plurality of curvature arresting features 106. However, in other embodiments the plurality of curvature arresting features 106 can be integral with so as to be formed as part of the first film 102. In other embodiments the plurality of curvature arresting features 106 can be molded, extruded, machined or otherwise formed on the first film 102. In some cases, a cast and cure process can be used to form the curvature arresting features 106, for example. In yet further embodiments, the plurality of curvature arresting features 106 may be captured between the first film 102 and the second film 104 but are not attached to or integral with either film 102, 104.

As shown in FIGS. 1 and 1A each of the plurality of curvature arresting features 106 have an extent in both the longitudinal and transverse direction. Various orientations for the plurality of curvature arresting features 106 are contemplated and further discussed in the present disclosure. As shown in FIG. 1, the plurality of curvature arresting features 106 can be disposed between interlocking devices 110A and 110B. Interlocking devices 110A and 110B can couple the first film 102 to the second film 104. In some cases, the interlocking devices 110A and 110B can restrain the first film 102 and the second film 104 from separation in a direction generally perpendicular to a surface 112 of the first film 102 (i.e. generally in the Z direction indicated in FIGS. 1 and 1A). In further embodiments, the interlocking devices 110A and 110B can be configured such that a controlled movement of the second film 104 relative to the first film 102 (or vice versa) is possible. Thus, in some embodiments the second film 104 is moveable relative to the first film 102 in at least one of the longitudinal direction or transverse direction.

As shown in the embodiment of FIG. 1, each of the plurality of curvature arresting features 106 can be have a substantially uniform thickness in the transverse direction. However in the embodiment of FIG. 1A, each of curvature arresting features 106 can have a thickness that varies in the longitudinal direction. In particular, in the embodiment of FIGS. 1 and 1A, each curvature arresting feature 106 has substantially a trapezoidal shape in cross-section such as provided in FIG. 1A. Thus, each of the plurality of curvature arresting features 106 can have top surface, bottom surface, and one or more side surfaces. The geometry of the plurality of curvature arresting features 106 will be discussed in further detail subsequently.

In the embodiment of FIGS. 1 and 1A, each of the plurality of curvature arresting features 106 can be separated from most adjacent other(s) of the plurality of curvature arresting features 106 by a gap G. For the purposes of this application, the gap G will describe a maximum distance between one of the plurality of curvature arresting features 106 and an adjacent most second of the plurality of curvature arresting features 106.

The gap G can be between about 10 µm and about 10 mm, inclusive, according to some embodiments. However, in some embodiments, no gap may be utilized, rather a rigid layer can be provided rather than the plurality of curvature arresting features 106. The gap can vary depending on the shape, size and materials used for the curvature arresting features 106. For example, the curvature arresting features of the embodiments of FIGS. 1-2, 6A, 7A and 20-22 can utilize a gap that is much larger (e.g., 100×) than the curvature arresting features of FIGS. 13-16, for example.

As is clearly shown in FIG. 1A, the geometry of the plurality of curvature arresting features 106 can be such that a distance between one of the plurality of curvature arresting features 106 and the most adjacent other(s) of the plurality of curvature arresting features 106 can vary when moving in one or more of the transverse direction, longitudinal direction, or latitudinal direction (corresponding to the Z direction shown). Thus, in some cases there may be no distance separating adjacent of the plurality of curvature arresting features 106 at a base thereof.

The gap G can be uniform so as to be substantially the same distance in some embodiments such as the embodiment of FIGS. 1 and 1A. However, in other embodiments the gap G can differ depending on the location within the first apparatus 100 such as in the transverse direction and/or longitudinal direction. A gap G may not be necessary in all embodiments. For example, highly nonlinear materials can be selected for the plurality of curvature arresting features 106 to provide for enhance curvature limiting capability to achieve a desired degree of curvature for the apparatus in some embodiments.

The plurality of curvature arresting features 106 can have substantially a same geometry in some embodiments. However, in other embodiments the geometry (i.e. the size and/or shape of one or more of the plurality of curvature arresting features 106 relative to others can vary. Similarly, the orientation of the plurality of curvature arresting features 106 can be substantially similar such as in the manner shown in FIGS. 1 and 1A such that substantially each of the plurality of curvature arresting features 106 extend parallel to one another in the transverse direction and spaced by the gap G in the longitudinal direction. However, as discussed above with regard to the gap G, in other embodiments one or more of the plurality of curvature arresting features 106 can be oriented differently than shown such as to provide gaps in the transverse direction or other directions, with a larger or smaller gap G, or in a non-parallel manner, for example.

The plurality of curvature arresting features 106 are distinct from one another (i.e., are not physically coupled together) in some embodiments such as the embodiment of FIGS. 1 and 1A. In other embodiments, the plurality of curvature arresting features 106 are physically coupled together such as part of a layer or integral part of the first film 102, for example. In some implementations, the interlocking devices 110A and 110B and/or curvature arresting features 106 can include air gap between individual features/components.

Various embodiments of the interlocking devices 110A and 110B are described in further detail subsequently. However, interlocking devices 110A and 110B may not be necessary in all embodiments. The interlocking devices 110A and 110B can comprise mechanical features that facilitate coupling in some embodiments. Such mechanical features can include one or more of adhesive, rails, slots, tabs, keys, snaps, snare/loop, hooks, fasteners, for example. In some embodiments, a male/female type connection between the interlocking devices 110A and 110 can be utilized. A snap-fit connection is also contemplated.

According to the embodiment of FIGS. 1 and 1A, the thickness of the first film 102 and second film 104 can be between 10 µm and 2000 µm. However, the thickness can vary depending on the desired application and other criteria. In some embodiments, the interlocking devices 110A and 110B have a thickness no more than 10 mm. In some cases, the interlocking devices 110A and 110B have a thickness no more than 1 mm. In some cases, the interlocking devices 110A and 110B have a thickness no more than 200 µm. In some cases, the interlocking devices 110A and 110B have a thickness no more than 100 µm. In some cases, the interlocking devices 110A and 110B have a thickness no more than 10 µm. In some cases, the interlocking devices 110A and 110B have a thickness no less than 5 µm.

The interlocking devices 110A and 110B can have a thickness on the order of 2.1 to 30 times larger than the first film 102 and/or second film 104. Each of the plurality of curvature arresting features 106 can have a similar thickness to that of the interlocking devices 110A and 110B according to some embodiments. In other embodiments, the thickness of each of the plurality of curvature arresting features 106 can be similar to or can vary from that of the interlocking devices 110A and 110B. The width of each of the plurality of curvature arresting features 106 in the longitudinal direction can be between 2 times and for 4 times that of the thickness according to some embodiments. The adhesive 108 can have a thickness between 5 time and 20 times less than the thickness of the first film 102 and/or second film 104. In one embodiment, the adhesive 108 can be between 25 µm and 1.25 mm, inclusive, for example depending on the desired application and other factors. In some embodiments, a second adhesive 114A and 114B (FIG. 1 only) can be utilized with the apparatus 100 to couple the interlocking devices 110A and 110B to the second film 104. If the second adhesive 114A and 114B is utilized, the thickness of the second adhesive can be between 0.01× and 0.80× as thick as the thickness of the plurality of curvature arresting features 106.

In some embodiments the apparatus 100 can include optically clear material(s), for example, optically clear film(s), optically clear adhesive, optically clear gel, optically clear liquid, or the like. The apparatus 100 can also use materials that have relative low viscosity, for example, a low viscosity liquid as a bonding material, to reduce resistance to bending. According to one embodiment, the first film 102 and the second film 104 comprise the same material(s). However, in other embodiments, the first film 102 and/or the second film 104 can be constructed of different materials. In some embodiments, the first film 102 and/or the second film 104 can be constructed of polymers, composites, superelastic materials (e.g., nitinol) or metal foils. Example polymers can include polyester terephthalate (PET), glycol modified polyethylene terephthalate (PETG), polymethylmethacrylate, polycarbonate, polyethylene naphthalate, cyclic olefin copolymer, polyimide or the like. According to some embodiments, the adhesive 108 can comprise an optically clear adhesives such as acrylate or silicone optical adhesive. The adhesive 108 can also comprise pressure sensitive and semi-structural and structural adhesives (e.g., acrylate, epoxy, urethane, etc.).

The interlocking devices 110A and 110B and/or the plurality of curvature arresting features 106 can be optically clear, for example, with visible light transmission of at least 85%, at least 90%, or at least 93%, in a path length of 10 mm, 1 mm, or 0.5 mm for example. The interlocking devices 110A and 110B and/or the plurality of curvature arresting features 106 can have a haze of less than at least 5%, less than 2%, or less than 1% in a path length of 10 mm, 1 mm, or 0.5 mm for example. The interlocking devices 110A and 110B and/or the plurality of curvature arresting features 106 can have a clarity of greater than 95%, greater than 98%, or greater than 99% in a path length of 10 mm, 1 mm, or 0.5 mm for example. Example materials that can be used by the interlocking devices 110A and 110B and/or the plurality of curvature arresting features 106 can include thermoplastic or thermosetting polymers, polymer composites, metals or ceramics. Example polymer composites can include inorganic particles and or inorganic fibers to increase the effective modulus of the interlocking devices. Example inorganic materials include silica, zirconia, silicon nitride, glass fibers, carbon fibers and the like. Example polymers may include acrylates, expoxies, polyurethanes, polyethelene, polyester terephthalate (PET), glycol modified polyethylene terephthalate (PETG), polymethylmethacrylate, polycarbonate, polyethylene naphthalate, cyclic olefin copolymer polyimide, acrylonitrile butadiene styrene (ABS), polypropylene, polyethylene terephthalate, polyester, polycarbonate, cyclic olefin copolymer, and/or nylon, or the like.

In some cases, the interlocking devices 110A and 110B and/or the curvature arresting features 106 can use materials that are not optically clear.

Figure 2:
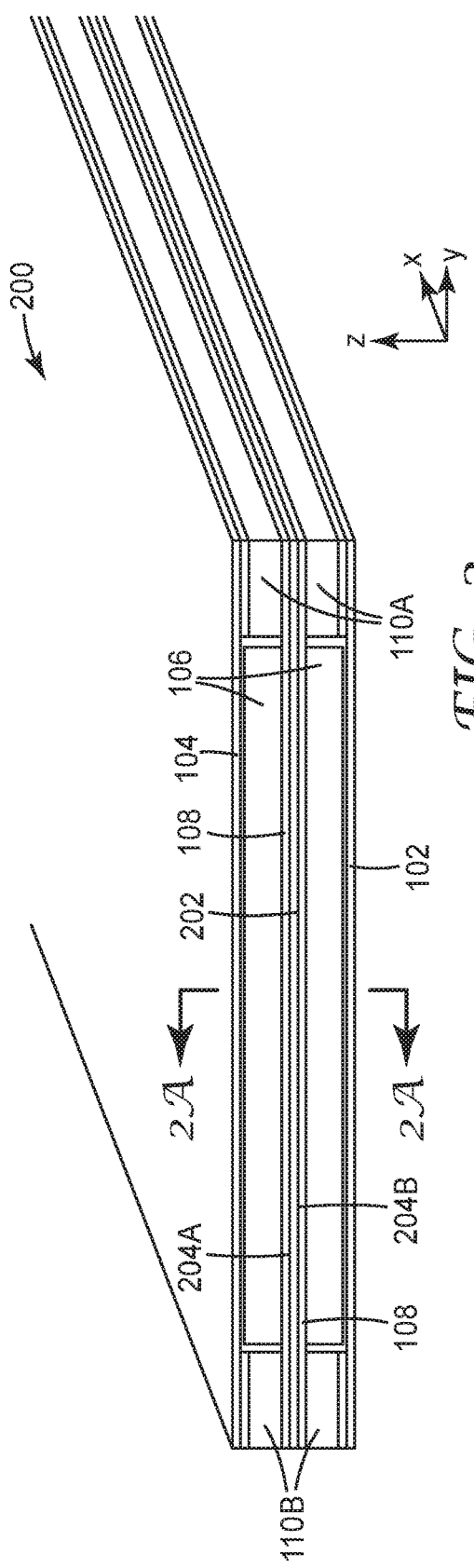
FIG. 2 is perspective view of a second apparatus according to another embodiment including additional of the plurality of components including additional curvature arresting features relative to the embodiment of FIG. 1.
Figure 2A:
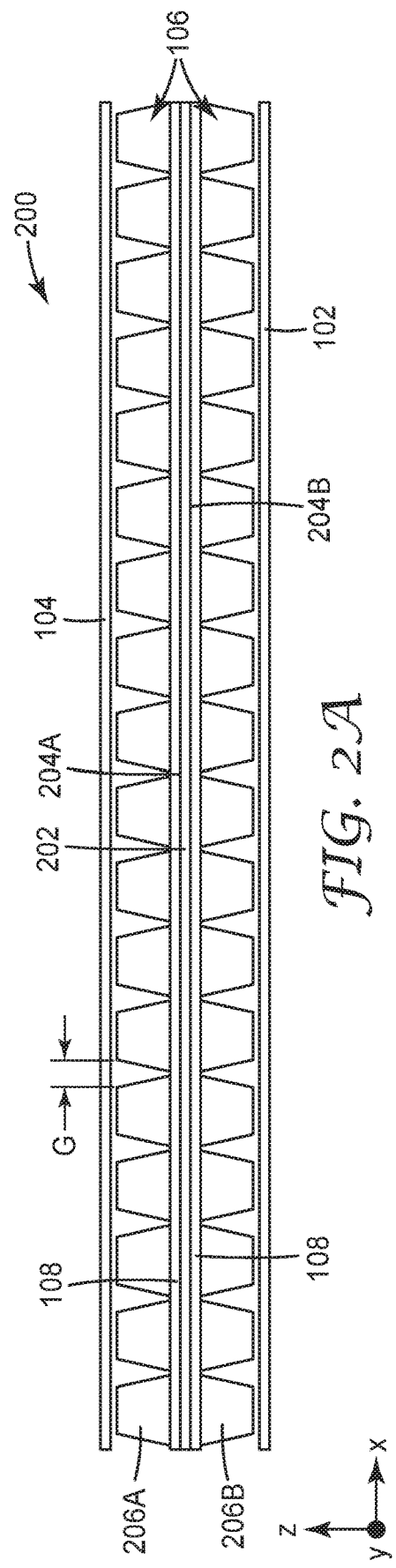
FIG. 2A is a cross-sectional view along A-A of the apparatus of FIG. 2.

FIGS. 2 and 2A show a second apparatus 200 having a construction similar to that of the first apparatus 100. Unless otherwise specified the apparatuses further disclosed herein can have a construction similar to that of the first apparatus 100 (e.g., can be of similar materials and/or can use similar components). Thus, the second apparatus 200 includes the first film 102, the second film 104, the plurality of curvature arresting features 106, the adhesive 108, and interlocking devices 110A and 110B (FIG. 2 only) as previously discussed. However, the second apparatus 200 has a dual sided construction with a third film 202 disposed between the first film 102 and the second film 104.

As illustrated in the embodiment of FIGS. 2 and 2A the plurality of curvature arresting features 106 and the interlocking devices 110A and 110B are attached both major surfaces 204A and 204B of the third film 202 by the adhesive 108. Due to this construction, a first plurality 206A of the plurality of curvature arresting features 106 have an inverted orientation about a plan defined by the third film 202 relative to a second plurality 206B of the plurality of curvature arresting features 106. There can be frictional contact between the first film 102 and the first plurality 206A of the plurality of curvature arresting features 106 and the second plurality 206B of the plurality of curvature arresting features 106 and the second film 104. However, the first film 102 and the second film 104 may not be attached to the plurality of curvature arresting features 106. The first plurality 206A of the plurality of curvature arresting features 106 are shown as having substantially a same shape and gap G as the second plurality 206B of the plurality of curvature arresting features 106 in the embodiment of FIG. 2A. However, in other embodiments the first plurality 206A of the plurality of curvature arresting features 106 can have a shape or gap that differs from the second plurality 206B of the plurality of curvature arresting features 106.

Figure 3:
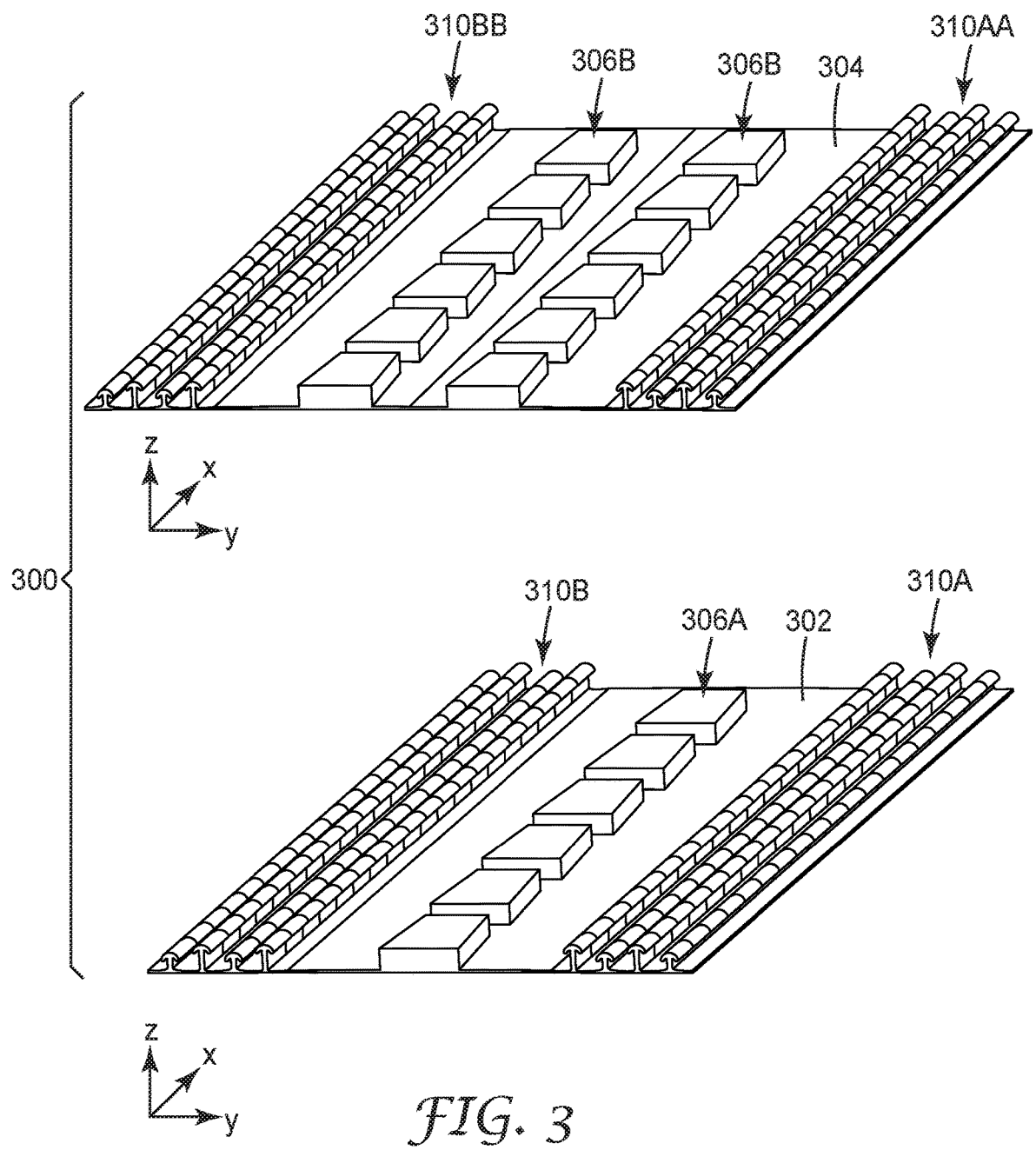
FIG. 3 is an exploded view of a third apparatus having two films each having curvature arresting features and interlocking devices according to one embodiment of the present disclosure.

FIG. 3 shows an exploded view of a third apparatus 300 that includes a first film 302, a second film 304, a plurality of curvature arresting features 306A and 306B and interlocking devices 310A, 310AA, 310B and 310BB. The embodiment of FIG. 3 shows the interlocking devices 310A, 310AA, 310B and 310BB having a rail and channel construction that will be further discussed in reference to FIGS. 4 and 5.

As shown in the embodiment of FIG. 3, the plurality of curvature arresting features 306A can be integral with so as to be formed from the first film 302. Similarly, the interlocking devices 310A and 310B can be integral with so as to be formed from the first film 302. Additionally, the plurality of curvature arresting features 306B can be integral with so as to be formed from the second film 304 and the interlocking devices 310AA and 310BB can be integral with so as to be formed from the second film 304.

As shown in FIG. 3, the plurality of curvature arresting features 306A, 306B have a trapezoidal shape when viewed in cross-section along the longitudinal direction (the x-axis direction indicated) similar to the plurality of curvature arresting features 106 previously discussed and illustrated. Additionally, the plurality of curvature arresting features 306A, 306B can have a trapezoidal shape when viewed in cross-section along the transverse direction (the y-axis direction indicated).

As discussed previously, some of the plurality of curvature arresting features 306A or 306B can contact adjacent ones of the plurality of curvature arresting features 306A or 306B when a bending force of sufficient magnitude is applied in a direction perpendicular to the longitudinal direction (a bending moment about the transverse direction corresponding to the y-axis direction) to flex the first film 302 and/or the second film 304. This construction can arrest curvature of the third apparatus 300 in the longitudinal direction. According to the embodiment of FIG. 3, some of the plurality of curvature arresting features 306A are also configured to contact some of the curvature arresting features 306B when a bending force of sufficient magnitude is applied in a direction perpendicular to the transverse direction (a bending moment about longitudinal direction corresponding to the x-axis direction) to flex the first film 302 and/or the second film 304. In this manner, a curvature of the third apparatus 300 in the transverse direction can be arrested. Thus, the apparatus 300 is arrested from having more than a desired curvature in both the longitudinal direction and the transverse direction.

Figure 4:
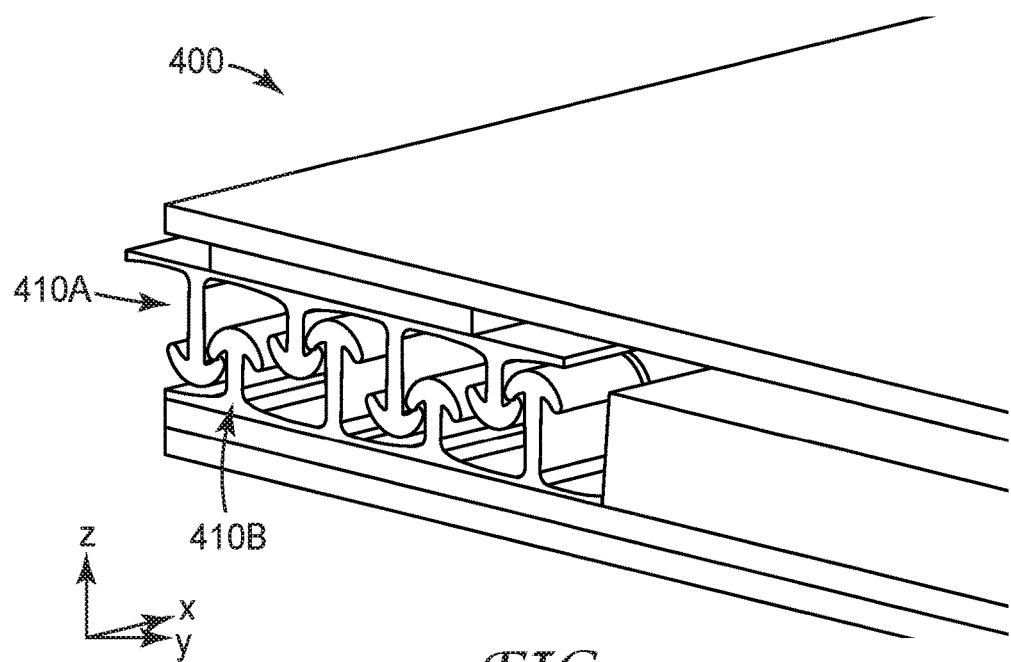
FIG. 4 is a perspective view of a portion of an fourth apparatus having two films interlocked by the interlocking devices and additionally having curvature arresting features disposed within the fourth apparatus according to one embodiment of the present disclosure.

FIG. 4 shows a portion of a fourth apparatus 400 with interlocking devices 410A and 410B. FIG. 4 shows engagement of the interlocking devices 410A and 410B, which can prevent relative movement between films such as in the z-axis direction (perpendicular to a surface of the film) or in the y-axis direction. However, the interlocking devices 410A and 410B can be configured to allow sliding relative motion there between. This can allow one or both of the films to be slid relative to one another.

Figure 5:
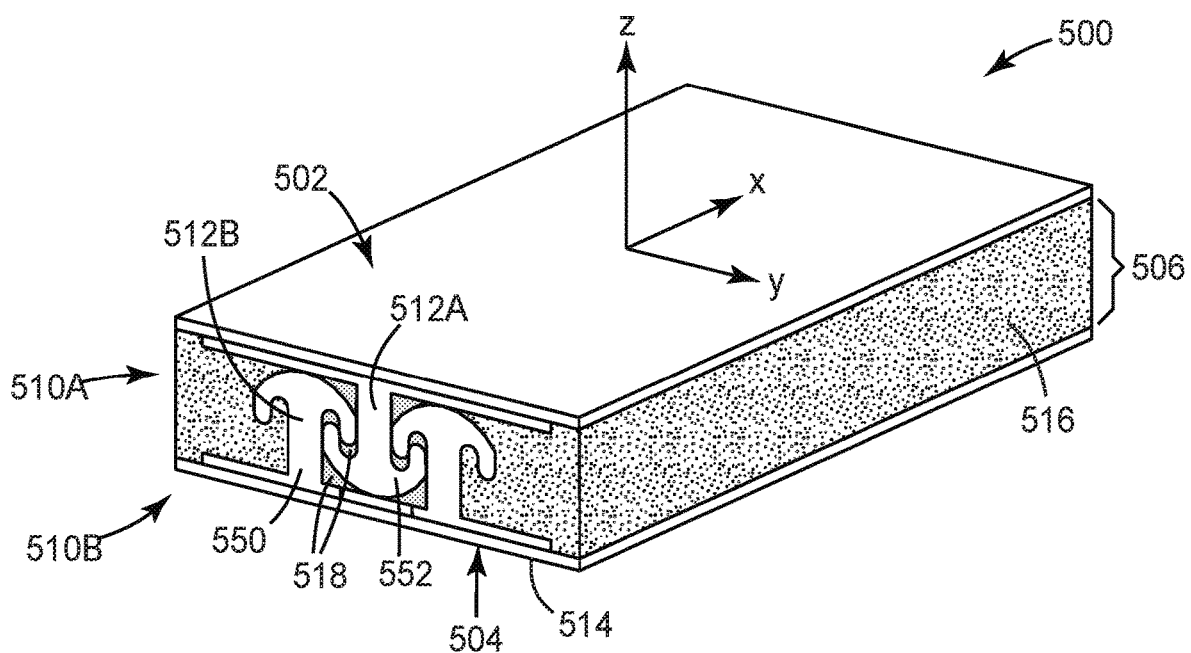
FIG. 5 is illustrates a close-up conceptual view of a portion of a fifth apparatus using the interlocking devices similar to those of the embodiments of FIGS. 3 and 4 according to one embodiment of the present disclosure.

Similarly, FIG. 5 shows a portion of the fifth apparatus 500 with interlocking devices 510A and 510B. As shown in FIG. 5, the fifth apparatus 500, as illustrated, includes a first film 502 (for example, a layer of a flexible component) and a second film 504 (for example, a layer of a rigid element or a second flexible component) and a bonding layer 506 disposed between the two films (502, 504). In the embodiment of FIG. 5, the bonding layer 506 includes the interlocking devices 510A and 510B. However, this is not the case in all embodiments. The interlocking device 510A includes one or more first interlocking components 512A attached to or integrated with the first film 502. In some cases, the interlocking devices 510A and 510B are attached to a respective film by a tie layer (not illustrated). In some embodiments, the tie layer may include an adhesive material, for example, such as an optically clear adhesive, a pressure sensitive adhesive, a hot-melt adhesive, or the like. The interlocking device 510B includes one or more second interlocking components 512B attached to or integrated with the second film 504. The one or more of the second interlocking components 512B are configured to engage with corresponding one or more of the first interlocking components 512A as illustrated.

In some embodiments, this engagement prevents the separation of the first film 502 from the second layer 504 along the z-axis direction perpendicular to a surface 514 of the second film 504. In some embodiments, this engagement provides little or no restriction of the first film 502 and/or second film 504 from sliding with respect to one another in the x-axis direction. In some cases, the one or more first interlocking components 512A and/or the one or more second interlocking components 512B are configured as rails to form channels that can facilitate or guide sliding between the films 502, 504 as described.

The one or more first interlocking component 512A and/or the one or more second interlocking component 512B can comprise a plurality of engagement elements such as a set of engagement elements with predetermined spacing to facilitate coupling. At least some of the engagement elements can have a cross-sectional shape having a stem 550 and a cap 552 that is constructed to be wider in the transverse direction than the stem, as illustrated in FIGS. 3-5. Engagement between the caps prevents separation or displacement along the z-axis direction. The caps can be configured as hooks to better maintain engagement there between. More configurations and relative spacing and materials of engagement rails are described in WO2016/196181, WO2016/196736, U.S. Pat. Nos. 6,357,128, 6,546,604, and 6,588,074, which are incorporated by reference in their entirety.

In some implementations, the bonding layer 506 can include bonding material 516 that can be disposed proximate to the first film 502 and the second 504 together with the interlocking devices 510A and 510B. In some cases, the bonding material 516 can include an optically clear material, for example, optically clear adhesive, optically clear gel, optically clear liquid, or the like. With the interlocking devices 510A and 510B, the bonding material 516 can use materials that have relative low viscosity, for example, a low viscosity liquid, to reduce resistance to bending. In some embodiments, the bonding material 516 can use a material that has a refractive index closely matching the refractive index of the interlocking devices 510A and 510B. In some cases, the bonding material 516 can have an overall refractive index that has an absolute difference less than or equal to 0.05 from the refractive index of the part of interlocking devices 510A and 510B, within the viewing area. For example, the bonding material 516 can include materials, for example, acrylates, urethanes, silicones, polyolefins, or the like. In some embodiments, the bonding material 516 could include thermal conductive particles to enhance heat dissipation, for example, Al2O3, metal or carbon particles. In some embodiments, the bonding material 516 could include dielectric or ferromagnetic particles to reduce electro-magnetic interference, for example, BaTiO3 or Fe3O4 particles.

In some embodiments, the interlocking devices 510A and 510B further comprise a coupling material 518 disposed proximate to the first interlocking component 512A and the second interlocking component 512B. In some cases, the coupling material 518 includes materials that have relatively low elastic modulus, low creep, and a high degree of shear strain under shear load to facilitate the repeated bending, for example, liquid, adhesive, gel, or the like. As an example, the coupling material 518 can include a low viscosity liquid to reduce frictional drag between interlocking components and reduce resistance to bending.

In some embodiments, the coupling material 518 can use materials that have relative low viscosity, for example, a low viscosity liquid, to reduce resistance to bending.

In other embodiments the coupling material 518 can use materials where the viscosity increases with strain rate providing a means of dampening or strain rate control. These are known as shear rate thickening or dilatant fluids. Dilatancy is a property that exists primarily in colloidal dispersions. A colloidal dispersion is where one substance is microscopically dispersed evenly throughout another. In some embodiments, the coupling material 518 could aid with heat transfer from the flexible component layer to the rigid members, which is also likely the primary heat sink. In some cases, the coupling material 518 could include thermal conductive particles to enhance heat dissipation, for example, Al2O3, metal or carbon particles. The coupling material 518 may include materials such as, for example, water, deionized water, glycol/water solutions, thermal grease such as 3M TCG-2035, and dielectric fluids such as fluorocarbons and polyalphaolefin. In some embodiments, the thermal conductivity of the coupling material 518 may range from 0.02 to 0.6 W/m·K. In some embodiments, the thermal conductivity of the coupling material 518 may range from 0.02 to 3.0 W/m·K. In some embodiments, the thermal conductivity of the coupling material 518 may range from 0.02 to 4.1 W/m·K. In some cases, the viscosity of the coupling material 518 may range from 5,000 cP to 100,000 cP. In some cases, the viscosity of the coupling material 518 may range from 0.89 cP to 542,000 cP. In some cases, the viscosity of the coupling material may range from 0.89 cP to 2,000,000 cP. In some cases, the coupling material 518 could include dielectric or ferromagnetic particles to reduce electro-magnetic interference, for example, BaTiO3 or Fe3O4 particles. In some cases, the coupling material 518 can use same materials as the bonding material 516.

In some embodiments, the coupling material 518 can use a material that has a refractive index closely matching the refractive index of the interlocking devices 510A and 510B, more particular the interlocking components 512A and 512B. In such cases, the optical clarity of the interlocking devices 510A and 510B can be restored by eliminating the air gaps between the interlocking components 512A and 512B. In some cases, the coupling material 518 can have an overall refractive index that has an absolute difference less than or equal to 0.05 from the refractive index of the part of interlocking devices 510A and 510B. For example, the coupling material 518 can include materials such as, for example liquids containing phenyl and phosphorus groups such as Santicizer 141 (available from Ferro Global at Mayfield Heights, Ohio, USA), or gels formulated using such liquids in combination with acrylate polymers using monomers containing higher refractive index contributing functional groups such as aromatic groups like phenyl, naphtyl, anthracyl, sulfur groups, bromine groups, or the like, to control and adjust the optical index of the gel. If a closely matching adhesive is used as coupling material 518 it cannot restrict the relative movement (i.e. relative sliding) of the interlocking devices 510A and 510B.

The bonding layer 506, bonding material 516 and coupling material 518 described herein can also be used in conjunction with the curvature arresting features described herein according to some embodiments. For example, such materials can be disposed between the gaps G of FIG. 1A.

Figure 6:
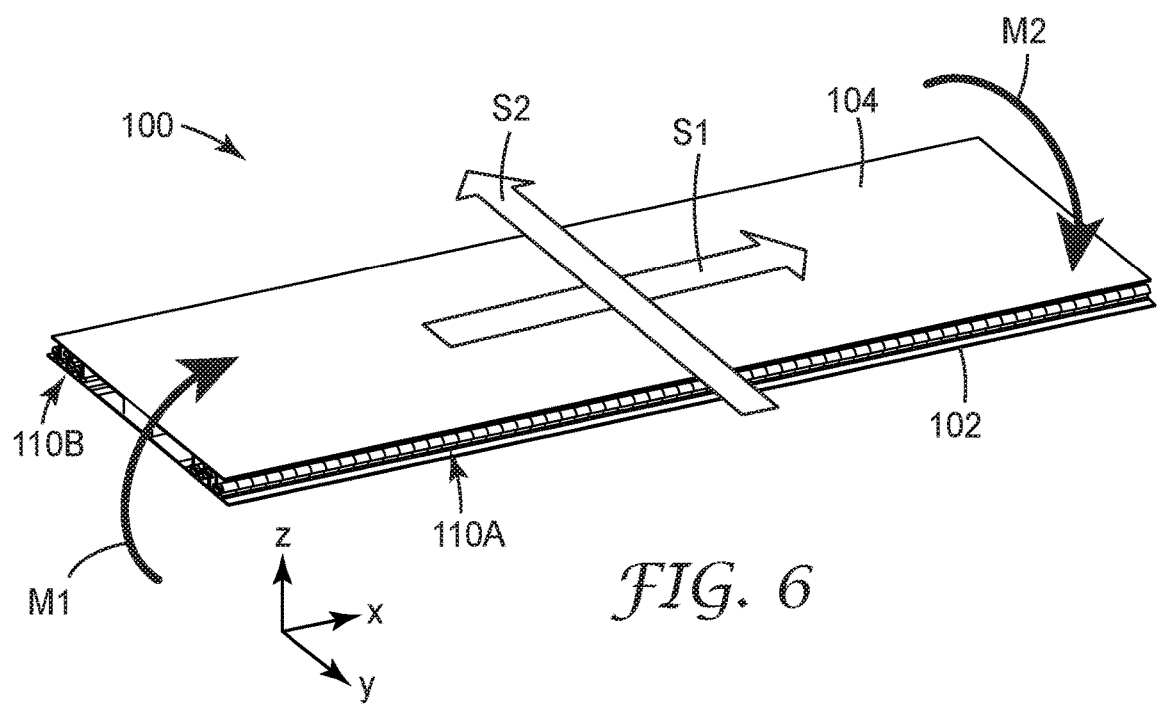
FIG. 6 is a perspective view of the first apparatus of FIG. 1 in an un-curved state and illustrating several forces including bending forces that can be applied to the first apparatus according to one embodiment of the present disclosure.

FIG. 6 returns to the first apparatus 100 previously described in reference to FIGS. 1 and 1A. FIG. 6 shows some of the forces S1, S2, M1, M2 that can be applied to the first apparatus 100. It should be noted that the first apparatus 100 can be subject to other forces not specifically illustrated or described, and that, forces S1, S2, M1, M2 are illustrated and described for demonstration purposes. For example, a shear force could be applied in a direction so as to have force components in the longitudinal direction (x-axis direction) and the transverse direction (y-axis direction). Similarly, other forces such as a compression force or moments could be present but are not specifically illustrated.

The first apparatus 100 can be subject to a shear force S1 (a tangential force) along the longitudinal direction (corresponding to the x-axis direction) in some instances. In some cases, this normal force S1 can be of a sufficient magnitude to cause relative motion between the first film 102 and the second film 104 in the longitudinal direction as described previously. Similarly, the first apparatus 100 can also be subject to a second normal force S2 along the transverse direction (corresponding to the y-axis direction) in some instances. Unlike the normal force S1, the normal force S2 may not cause relative motion between the first film 102 and the second film 104 due to the interlocking devices 110A and 110B, which can be configured to restrain relative motion between the first film 102 and the second film 104 in the illustrated embodiment.

FIG. 6 also illustrates an applied force moment M1, which comprises a bending force in a direction perpendicular to the longitudinal direction (a bending moment about the transverse direction corresponding to the y-axis direction). This force moment M1, if of a sufficient magnitude, can cause curvature (bowing) of the first film 102 and/or the second film 104 and can reduce the overall length of the first apparatus 100 in the longitudinal direction. As described previously, the curvature arresting features 106 (FIGS. 1, 1A and 6A) can be configured to arrest this curvature. Thus, the curvature arresting features 106 can be configured to arrest curvature of the second apparatus 100 in the longitudinal direction.

Figure 23:
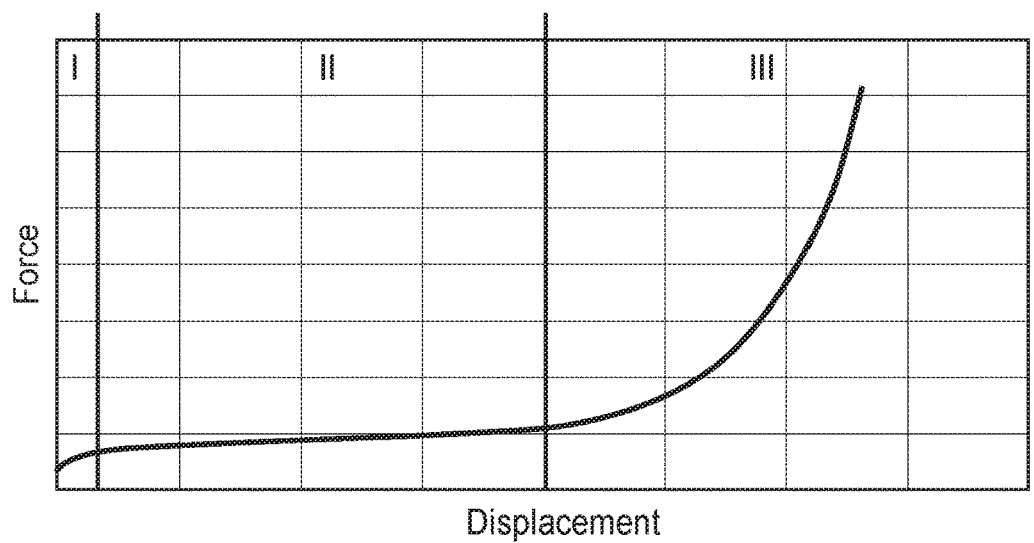
FIG. 23 is a plot of applied force v. displacement for apparatuses such as those described that include the curvature arresting features according to one embodiment of the present disclosure.

Regarding arrest of curvature, reference can also be made to FIG. 23, which shows a plot of an applied compressive force v. platen displacement for an apparatus having curvature arresting features. As shown, zone I represents a first applied force that is applied a lower range of magnitude. This first applied force is necessary to overcome static friction in the interlocking devices 110A and 110B (FIG. 1A) and/or any other static friction due to components to initiate sliding of the second film 104 relative to the first film 102. Zone II represents a second applied force having a middle range of magnitude (a magnitude that can exceed the magnitude of the force in zone I). In Zone II, the second applied force moves in a relatively linear relationship to the displacement of the second film 104 relative to the first film 102 as the interlocking devices 110A and 110B (FIG. 1A) or other components freely slide subject to kinetic friction. In Zone II, the curvature arresting features have yet to come into contact with one another. Vertical line V indicates a degree of curvature for the apparatus at which at least some of the curvature arresting features provide stiffening to the apparatus. If gaps are utilized with the curvature arresting features, stiffening can occur when features come into contact with one another (e.g., a gap no longer exists between at least some of the curvature arresting features). At this point, the force v. displacement plot enters Zone III. Contact between at least some of the curvature arresting features can increase the stiffness of the apparatus in a non-linear manner. Thus, in Zone III, relatively greater degrees of applied force (a third applied force having a relatively higher magnitude than those of the second applied force and the first applied force) are needed to achieve displacement. Furthermore, the degree of applied force needed for displacement will increase with increased displacement because more and more of the curvature arresting features come into contact with one another. By way of example, the slope of the plot of force v. displacement in Zone III is 4× or more times larger than the slope of the plot of force v. displacement in Zone II. Thus, a 4× or larger force is required to achieve a similar degree of displacement in Zone III as compared to Zone II.

Put another way and in reference to FIG. 23, during flexural loading of an apparatus that utilizes curvature arresting features and/or interlocking devices as described herein a common flexural force versus displacement curve can be obtained. The instantaneous slope of the curve represents the flexural stiffens of the apparatus during different stages of the test. Using various devices including those discussed in reference to Working Example 1 a graph, FIG. 23, can be obtained and broken into three zones. Zone I is a non-linear response to the friction in the system as the interlocking devices begin to slide as the internal interlocking devices interaction properties change from static to kinetic friction. Zone II is a relatively linear response to kinetic sliding of the interlocking devices. A positive slope is expected in this region as the apparatus materials undergo elastic deformation. Zone III describes an increase in the apparatuses' stiffness as the gap between some or all of the curvature arresting features approaches and obtains a value of zero. The magnitude of displacement at the transition between zones II and III can be adjusted through modifying the curvature arresting features physical dimensions (Gap, Width, Height, Angle—refer to FIG. 8). The stiffness and total force the apparatus can sustain can be modified through utilizing materials with higher modulus values and modifying the curvature arresting features physical dimensions (Gap, Width, Height, Angle—refer to FIG. 8).

FIG. 6 also illustrates a second applied force moment M2 on the apparatus 100. This force moment M2 comprises a bending force applied in a direction perpendicular to the transverse direction (a bending moment about the longitudinal direction corresponding to the x-axis direction). If the force moment M2 is of sufficient magnitude, this can cause curvature (bowing) of the first film 102 and/or the second film 104 and can reduce the overall length of the first apparatus 100 in the transverse direction. In some embodiments, the curvature arresting features 106 may not be configured to arrest this curvature such as in the manner previously described with reference to FIG. 3. However, in other embodiments, it may be desirable not the have the curvature arresting features 106 configured to arrest this type of curvature. This can allow the apparatus 100 to be relatively more bendable (have a reduced stiffness) in one direction (here the transverse direction) than a second direction (here the longitudinal direction). Thus, in some cases, the stiffness (and hence bendability) of the first apparatus 100 can differ in one direction relative to the second direction.

Figure 6A:
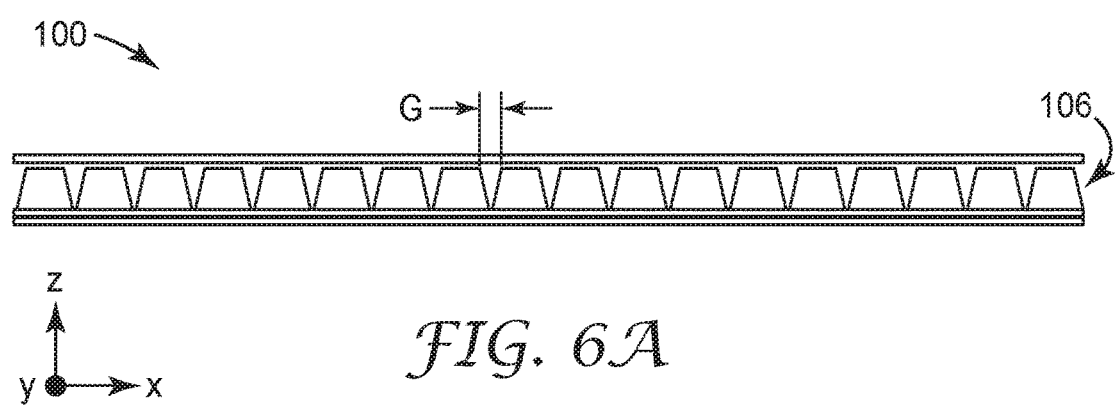
FIG. 6A is a cross-sectional view of the first apparatus of FIG. 6 showing the disposition of the curvature arresting features in the un-curved state.

FIG. 6A shows a cross-section of the first apparatus 100 with the features previously described in reference to FIG. 1A. In FIG. 6A, the applied forces either are not present or are not of sufficient magnitude to cause curvature of the apparatus 100 in the longitudinal direction. Thus, in FIG. 6A the gaps G remain between the plurality of curvature arresting features 106 when the first apparatus 100 is in an un-curved state.

Figure 7:
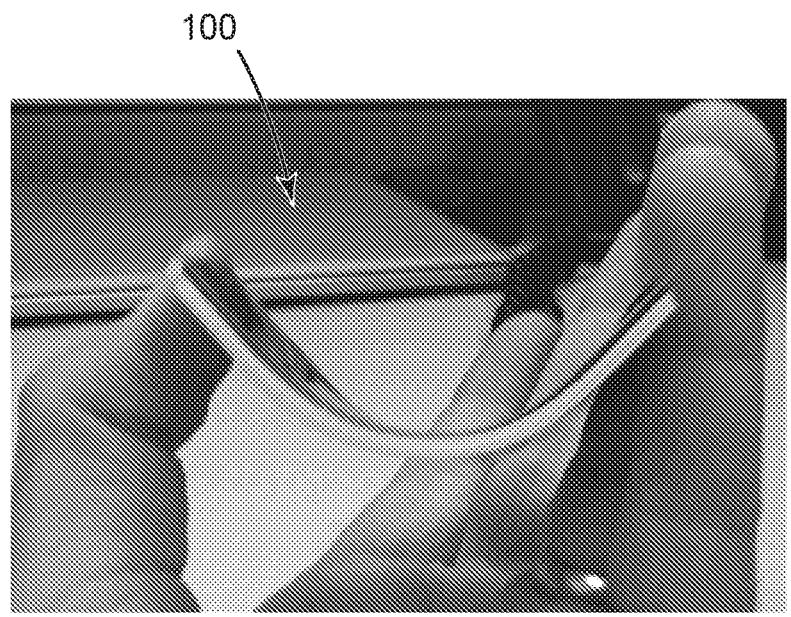
FIG. 7 is a perspective view of the first apparatus of FIG. 6 in a curved state with a bending force applied to the first apparatus.
Figure 7A:
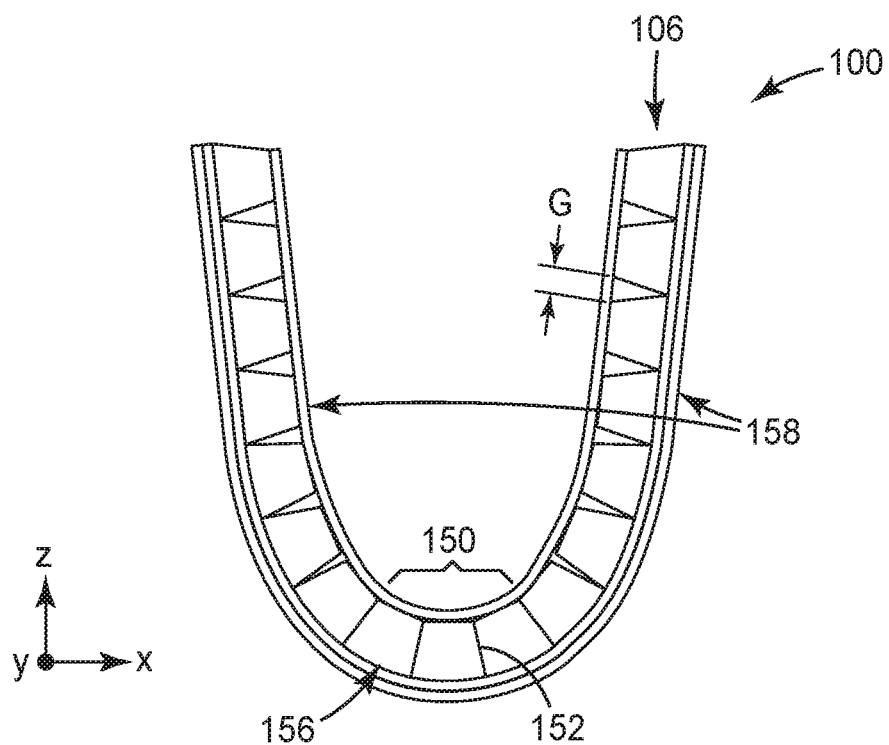
FIG. 7A is a cross-sectional view of the first apparatus of FIG. 7 showing the disposition of the curvature arresting features in the curved state, at least some of the curvature arresting features engaging one another to arrest a curvature of the first apparatus according to one embodiment of the present disclosure.

FIG. 7 shows the first apparatus 100 subject to the applied force moment M1 (FIG. 6). The applied force movement M1 is sufficient to cause curvature of the first apparatus 100 in the longitudinal direction. Thus, the first apparatus 100 is in a curved state. FIG. 7A shows a cross-section of the first apparatus 100 in the curved state. As shown in FIG. 7A, some of the plurality of curvature arresting features 106 comprising a first plurality of curvature arresting features 150 contact one another at side surfaces 152 in section 156 that has a greater degree of curvature than a remainder of the first apparatus 100. As discussed previously, such contact can arrest curvature of the first apparatus 100 in the longitudinal direction (x-axis direction). Additionally, some of the plurality of curvature arresting features 106 comprising a second plurality of curvature arresting features 158 are not in contact with one another such that a gap G remains. As shown in FIG. 7A the size of the gap G can vary depending on proximity to the section 156.

Working Example 5 discusses a specific embodiment of FIG. 7 utilizing specific materials, curvature arresting feature design, and the like.

FIGS. 8-19F provide additional configurations for the curvature arresting features and/or interlocking devices that can be used with apparatuses according to various embodiments.

Figure 8:
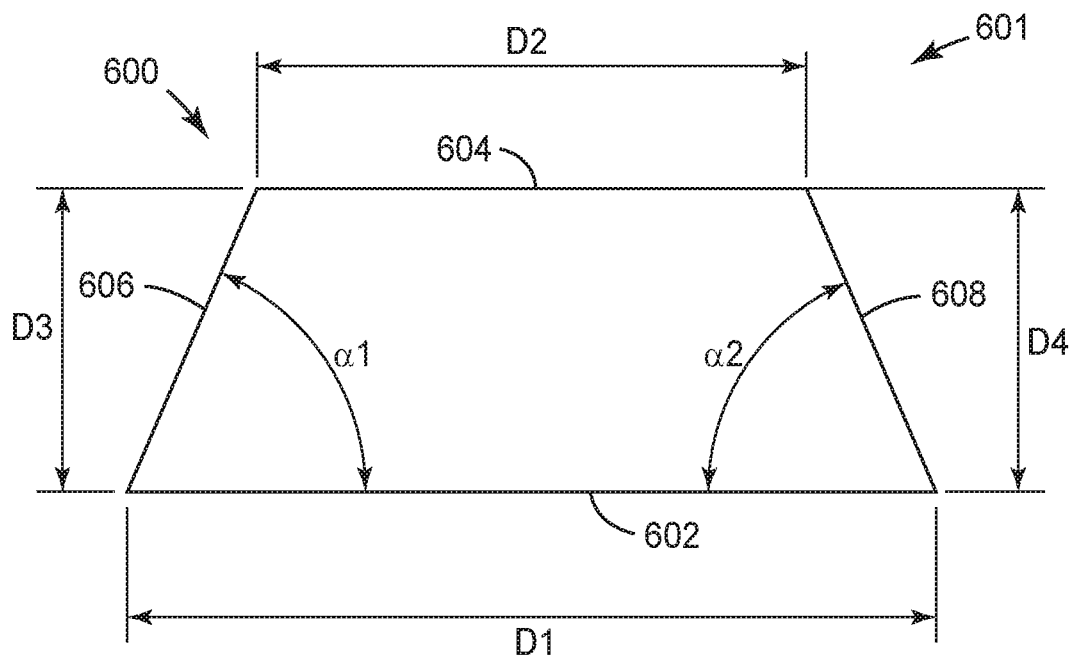
FIG. 8 is a plan view showing an exemplary geometry of one of the curvature arresting features according to one embodiment of the present disclosure.

FIG. 8 shows an exemplary geometry for a single curvature arresting feature 600 that can be used as part of an apparatus 601. The curvature arresting feature 600 is shown in isolation in FIG. 8. Similar to some of the curvature arresting features previously discussed, the curvature arresting feature 600 can have a trapezoidal shape in cross-section. However, other shapes such as rectangular with a chamfered side surface(s) are contemplated. Thus, the curvature arresting feature 600 can include a first major surface 602, a second major surface 604, a first side surface 606 and a second side surface 608. According to the embodiment of FIG. 8, the first major surface 602 can be disposed parallel with the second major surface 604. However, such a configuration is not necessary in all embodiments. The extent of the first major surface 602 as indicated by D1 can exceed that of the second major surface 604 as indicated by D2. The first major surface 602 can be disposed a distance D3 from the second major surface 604 on the first side surface 606 and can be disposed a same or different distance D4 from the second major surface 604 on the second side surface 608.

The first side surface 606 can extend between the first major surface 602 and the second major surface 604. The first major surface 606 can form a first acute angle α1 with the first side surface 606. The second side surface 608 can extend between the first major surface 602 and the second major surface 604. The second major surface 608 can form a second acute angle α2 with the first side surface 606. Although the first acute angle α1 and the second acute angle α2 are illustrated as being substantially the same in FIG. 8, in other embodiments these angles can differ.

According to some embodiments the extent of the first major surface can be between about 10 μm and about 10 mm, inclusive, according to some embodiments. For example, the curvature arresting features of the embodiments of FIGS. 1-2, 6A, 7A and 20-22 can utilize a dimension for the first major surface that is much larger (e.g., 100×) than the curvature arresting features of FIGS. 13-16, for example. D3 can have a dimension of between 500 µm and about 10 mm, inclusive according to some embodiments. Similarly, D4 can have a dimension between 500 µm and about 10 mm, inclusive according to some embodiments. The first and second acute angles α1, α2 can be between 0° and 20°, inclusive. Thus, with 0° the curvature arresting features would have substantially a rectangular shape in cross-section or rectangular shape with a small degree of chamfer in cross-section. The 0° embodiment could have some gap G so as to space the curvature arresting features apart as previously described in reference to FIGS. 1A, 2A, 6A and 7A and is further described in FIG. 10 to provide for curvature arrest of the apparatus. However, recall that in some embodiments, no gap may be utilized, rather a rigid layer can be provided rather than the plurality of curvature arresting features. The gap can vary depending on the shape, size and materials used for the curvature arresting features.

Figure 9:
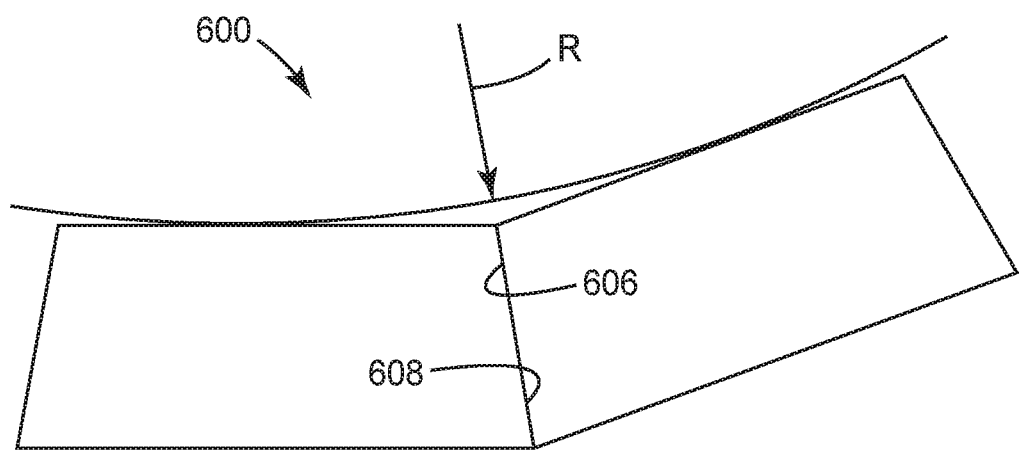
FIG. 9 is a plan view showing two of the curvature arresting features having the geometry of FIG. 8 engaging one another in a manner that would arrest the curvature of an apparatus according to one embodiment of the present disclosure.

FIG. 9 shows two of the curvature arresting features 600 engaging one another such as in the curved state previously described and illustrated in FIGS. 7 and 7A. As shown in FIG. 9, engagement between the curvature arresting features 600 can occur along adjacent most side surfaces 606 and 608. However, in other embodiments engagement can also occur along one or both of the first major surface 602 and/or the second major surface 604. In other embodiments, rather than simply having a single side surface on each side, the curvature arresting features can include two or more surfaces that together comprise the side surface. Although not illustrated in FIG. 9, the curvature arresting features 600 can be integral with or attached to a same film.

Figure 9A:
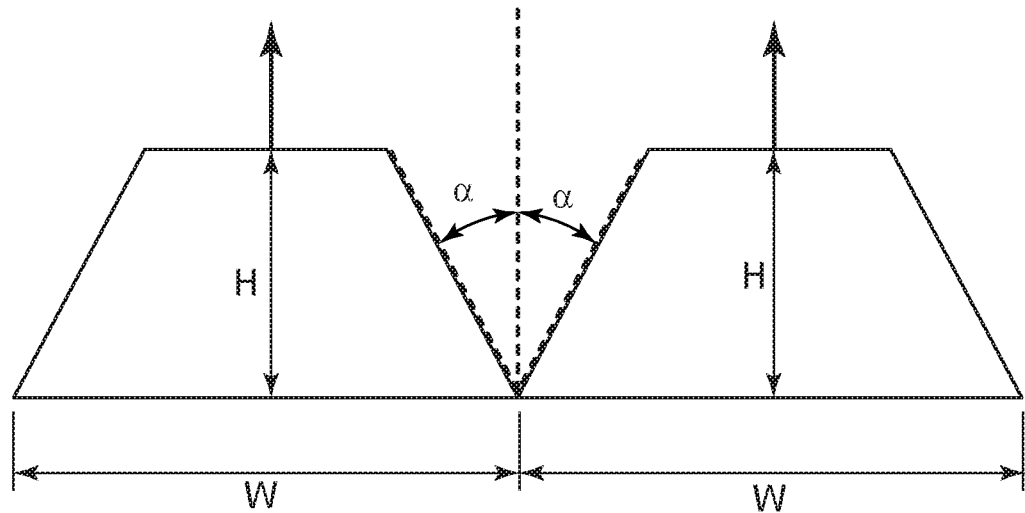
FIGS. 9A and 9B show two trapezoidal shapes such as those used for curvature arresting features and a relationship between these two shapes can be used to determine a radius R as shown in FIG. 9 using Equations 1-5.
Figure 9B:
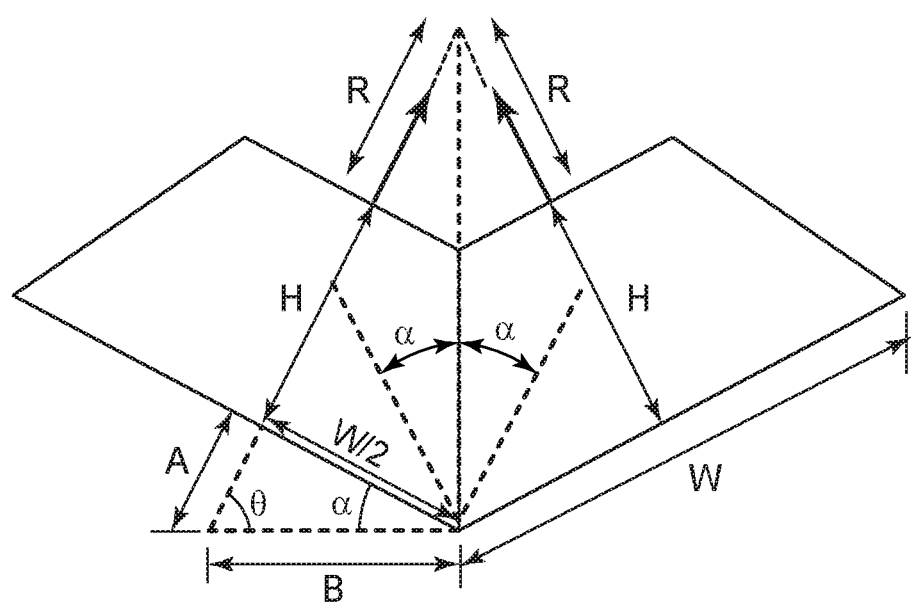

As shown in FIGS. 9A and 9B, a relationship can be evaluated, through the use of trigonometric identities, for one embodiment of the curvature arresting features, to relate the effective device radius in the arrested state to the physical dimensions, H, W and α. Utilizing FIG. 8 as a guide and assuming; D3=D4=H, α1=α2=(90−α), and D1>D2, we can determine two length values, A and B, that describe a point collinear with center of the radius of the device, the center of span D1, and the center of span D2, as described in FIG. 8. The quantity A can be obtained through Equation 1. Where Equation 1 is:

$$A = D½ * \tan(\alpha)$$

The quantity B can be obtained through Equation 2. Where Equation 2 is:

$$B = D1/(2\cos(\alpha))$$

θ can be obtained through Equation 3, where Equation 3 is:

$$\theta = \pi/2 - \alpha$$

Equation 4 proposes a relationship between the quantities G, α, and D3=D4=H. Equation 4 is:

$$\tan(\alpha) = G/2H$$

Utilizing these values, we can calculate the effective radius of the curvature arresting device using Equation 5 in terms of the quantities, B, A, H, and θ. Equation 5 is:

$$R = B/(\cos(\theta)) - H - A$$

Figure 10:
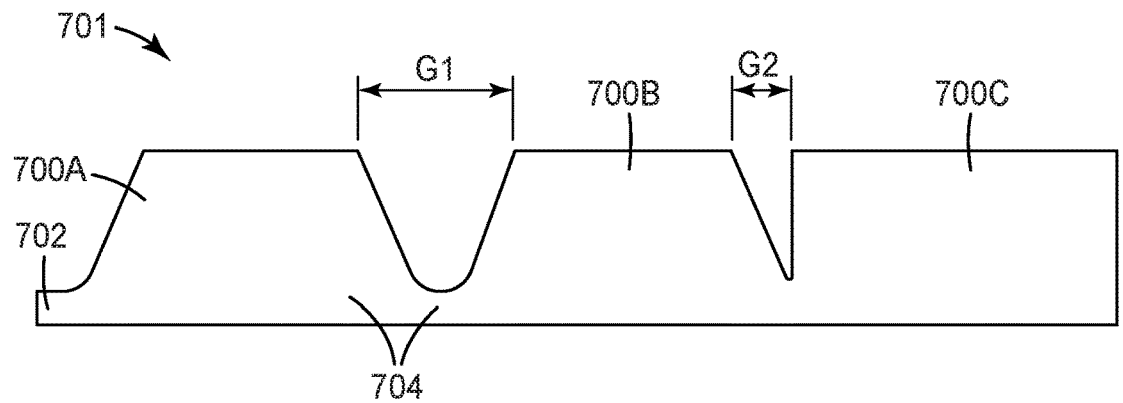
FIG. 10 is a plan view of further exemplary geometries for the curvature arresting features according to one embodiment of the present disclosure.

FIG. 10 show a plurality of curvature arresting features 700A, 700B and 700C that can be used as part of an apparatus 701 according to another embodiment. As shown in the embodiment of FIG. 10, some of the curvature arresting features such as curvature arresting feature 700C has a geometry that differs from those of curvature arresting feature 700A and 700B. Additionally, FIG. 10 illustrates that the plurality of curvature arresting features need not have a trapezoidal shape in cross-section in all embodiments. Indeed, the curvature arresting feature 700C can be rectangular in cross-section, and therefore, has an angle (e.g., α1 in FIG. 8) of 0° (i.e., extends substantially perpendicular to a surface of a first film 702).

According to the example of FIG. 10, the plurality of curvature arresting features 700A, 700B and 700C can be integral with the first film 702 and/or can be formed as part of a web that is less than 20% of a total thickness of the curvature arresting features 700A, 700B and 700C. Thus, the first film 702 can form a base portion 704 of each of the plurality of curvature arresting features 700A, 700B and 700C. As such, the plurality of curvature arresting features 700A, 700B and 700C are not physically separated from one another but instead share the same base portion 704 (e.g., the web referenced above). Additionally, as shown in FIG. 10, the gaps G1 and G2 between some of the curvature arresting features 700A, 700B and 700C can vary relative to one another. Additionally, a radius between the curvature arresting features 700A, 700B and 700C can vary relative to one another or may not exist. Similarly, an angle (e.g., α1 in FIG. 8) of the side surfaces can vary between the plurality of curvature arresting features 700A, 700B and 700C.

Figure 11:
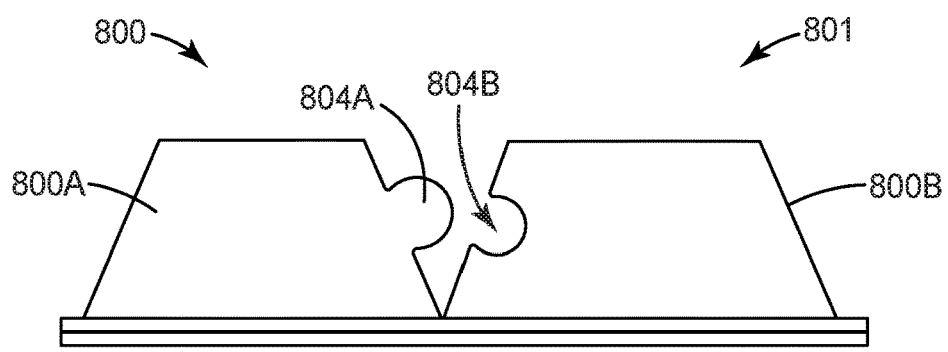
FIG. 11 is a plan view of yet another example of the curvature arresting features having an interlocking design to facilitate maintaining a curvature of an apparatus even if the bending force is removed according to one embodiment of the present disclosure.
Figure 12:
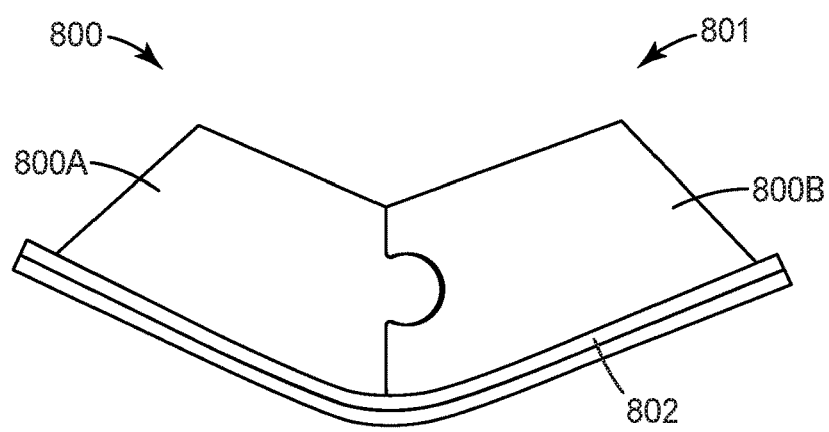
FIG. 12 shows the curvature arresting features of FIG. 11 having been moved into engagement to maintain the curvature of the apparatus in the curved state.

FIG. 11 shows another embodiment of a plurality of curvature arresting features 800 that can be used as part of an apparatus 801. FIG. 11 shows the plurality of curvature arresting features 800 in an un-curved state. The plurality of curvature arresting features 800 include a first curvature arresting feature 800A and a second curvature arresting feature 800B. FIG. 12 shows the plurality of curvature arresting features 800 in a curved state interlocking with one another to maintain a desired curvature. As shown in FIG. 12, the first curvature arresting feature 800A can be configured to interlock with the second curvature arresting feature 800B feature during bending of a first film 802 to maintain curvature of the first film 802 at a desired degree. Due to the interlock of the first curvature arresting feature 800A with the second curvature arresting feature 800B, the curvature of the first film 802 can be maintained without continuously supplying a force moment on the first film 802. More particularly, the first curvature arresting feature 800A includes a first coupling feature 804A and the second curvature arresting feature 800B includes a second coupling feature 804B. The first coupling feature 804A is configured as a male protrusion designed to mate with the second coupling feature 804B, which comprises a female recess. Such engagement can form a snap-fit connection between the first curvature arresting feature 800A and the second curvature arresting feature 800B, for example. However, in other embodiments other types of engagement to couple the first curvature arresting feature 800A to the second curvature arresting feature 800B are contemplated. For example, a hook facilitated connection can be used in other embodiments.

FIGS. 11 and 12 show a single connection between two curvature arresting features 800. However, apparatuses can include further curvature arresting features some or all of which can have coupling features configured to couple adjacent of the curvature arresting features together. It is contemplated that the curvature arresting features 800 can move back-and-forth from the curved and un-curved states shown in FIGS. 11 and 12 as desired in a repeating fashion. Thus, for example, the snap-fit connection between the first curvature arresting feature 800A and the second curvature arresting feature 800B can be repeatedly formed and dissolved through interlocking engagement and disengagement between the first curvature arresting feature 800A and the second curvature arresting feature 800B.

Figure 13:
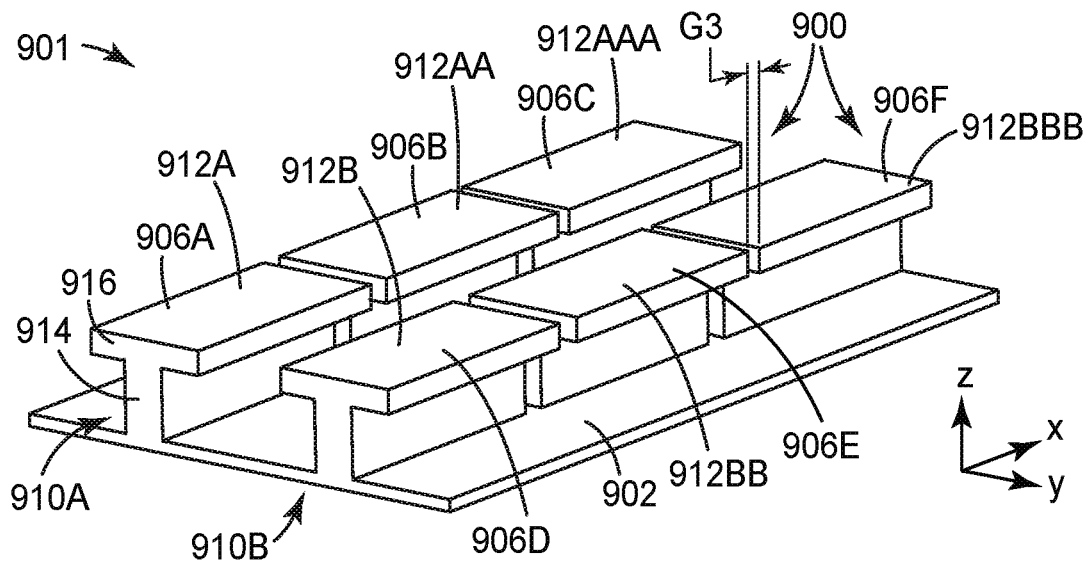
FIG. 13 is a perspective view of a portion of a sixth apparatus in an un-curved state employing interlocking devices that are also curvature arresting features according to an embodiment of the present disclosure.
Figure 14:
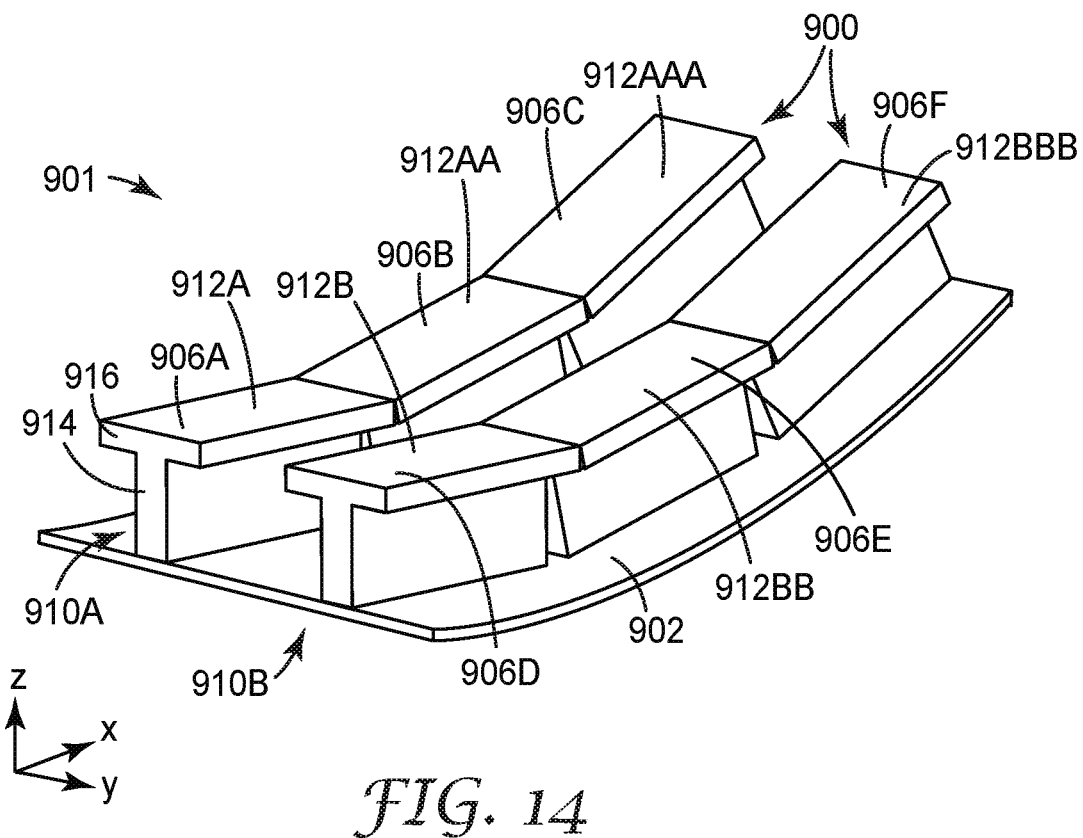
FIG. 14 is a perspective view of the sixth apparatus of FIG. 13 in a curved state.

FIGS. 13 and 14 show another embodiment that includes features 900 that can be used with an apparatus 901. The features 900 can be configured to serve as both curvature arresting features and interlocking devices in the manners previously discussed. The features 900 are shown in isolation as being integral with a first film 902 in FIGS. 13 and 14. For simplicity, a second plurality of features and a second film are not shown in FIGS. 13 and 14.

More particularly, the embodiment of FIGS. 13 and 14 show features 900 comprise a plurality of interlocking devices 910A and 910B comprising six interlocking components 912A, 912AA, 912AAA, 912B, 912BB and 912BB having a rail and channel construction described previously in reference to FIGS. 3-5. The six interlocking components 912A, 912AA, 912AAA, 912B, 912BB and 912BB each have a cross-sectional shape having a stem 914 and a cap 916 that is constructed to be wider in the transverse direction (corresponding to the y-axis direction) than the stem 914. Engagement between the caps with other caps extending from a second film (not shown) prevents separation or displacement of the second film from the first film 902 along the z-axis direction as previously discussed in reference to FIGS. 3-5.

As shown in FIG. 13, when the first film 902 is in the un-curved state, each of the features 900 are separated from one another by a gap G3. The extent of this gap G3 can be the same as or similar to that of the gap G previously described in reference to the previous FIGURES. In some cases, the gaps G3 may be formed by a small angle between adjacent of the features 900. For example, such angle can be on the order of 1° to 10°, from the direction perpendicular to a surface 903 of the first film 902. When the first film 902 is subjected to a bending force so as to be in the curved state illustrated in FIG. 14, the gap G3 can be eliminated as each of the features 900 engages an adjacent most feature. Engagement between the features 900 can arrest the curvature of the first film 902. More particularly, the features 900 includes six curvature arresting features 906A, 906B, 906C, 906D, 906E and 906F. The curvature arresting feature 906B is spaced from the curvature arresting features 906A and 906C respectively by gaps G3 in FIG. 13. Similarly, the curvature arresting feature 906E is spaced from the curvature arresting features 906D and 906F respectively by gaps G3 in FIG. 13. However, the gaps G3 can be eliminated upon application of the bending force of sufficient magnitude to cause the curvature of the first film 902 illustrated in FIG. 14. In particular, the curvature of the first film 902 brings the curvature arresting features 906A and 906C into engagement with the curvature arresting feature 906B and bring the curvature arresting features 906D and 906F into engagement with the curvature arresting feature 906E. Such engagement can arrest the curvature of the first film 902 in the longitudinal direction (corresponding to the x-axis direction).

In some embodiments, the gaps G3 can extend fully in the z-axis direction through the features 900, for example, the entirety of the cap 916, stem 914, and even the first film 902. As another example, the gaps G3 can be an opening through only a portion of the cap 916 and/or stem 914. In other embodiments, the gaps G3 can have a predefined width, which may allow bending along both directions (i.e., inward and outward) that are generally perpendicular to the surface 903 of the first film 902. The features 900 can be utilized along substantially the entire length of apparatus, or can be used only in selected location(s) according to other embodiments. In addition to providing for bending arresting of the curvature of the first film 902 as described above, the features 900 can improve bending flexibility of the first film 902 and the interlocking devices 910A and 910B formed thereof.

Figure 15:
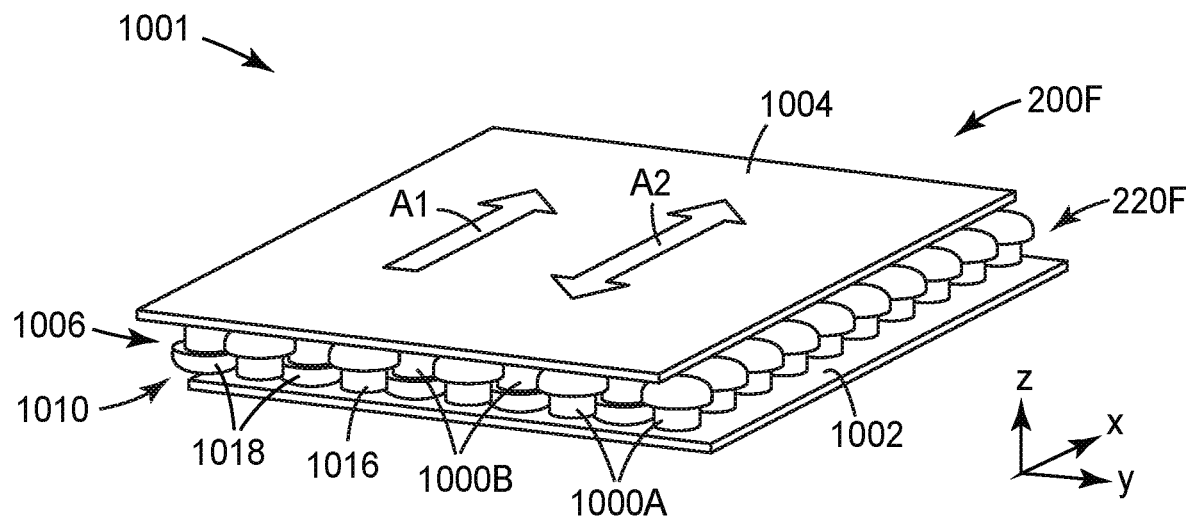
FIG. 15 is a perspective view of a portion of a seventh apparatus in an un-curved state employing interlocking devices that are also curvature arresting features according to an embodiment of the present disclosure.

FIG. 15 illustrates another example of features 1000A and 1000B that can be used as part of an apparatus 1001. The features 1000A and 1000B can comprise both curvature arresting features 1006 and interlocking devices 1010 in the manners previously discussed. Thus, the features 1000A and 1000B can engage one another to arrest a curvature of a first sheet 1002 and/or second sheet 1004 as shown in FIG. 16 and can additionally engage to prevent a separation of the first film 1002 from the second film 1004 along the z-axis direction perpendicular to a surface 1014 of the second film 1004.

Figure 16:
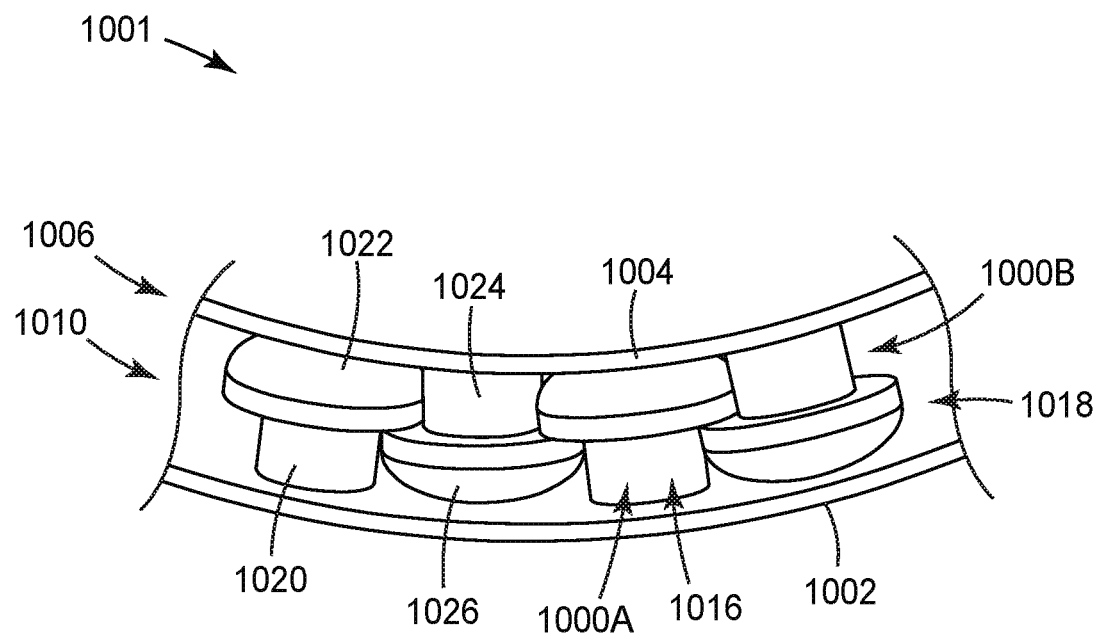
FIG. 16 is an enlarged view of some of the interlocking devices of the seventh apparatus of FIG. 15 with the seventh apparatus now in a curved state, FIG. 16 showing engagement between the interlocking devices which arrests the curvature of the seventh apparatus.
Figures 18A, 18B, 18C:
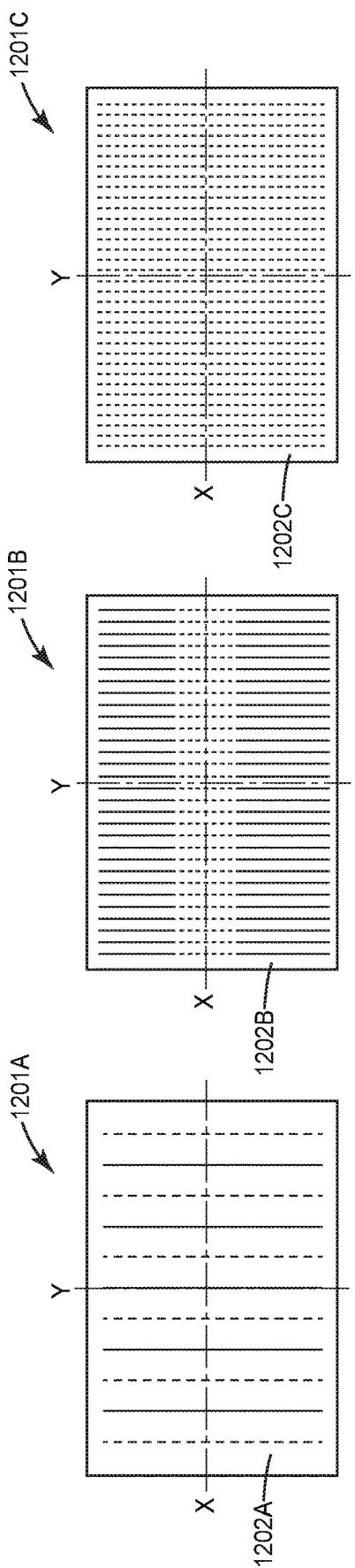
Figures 18D, 18E, 18F:
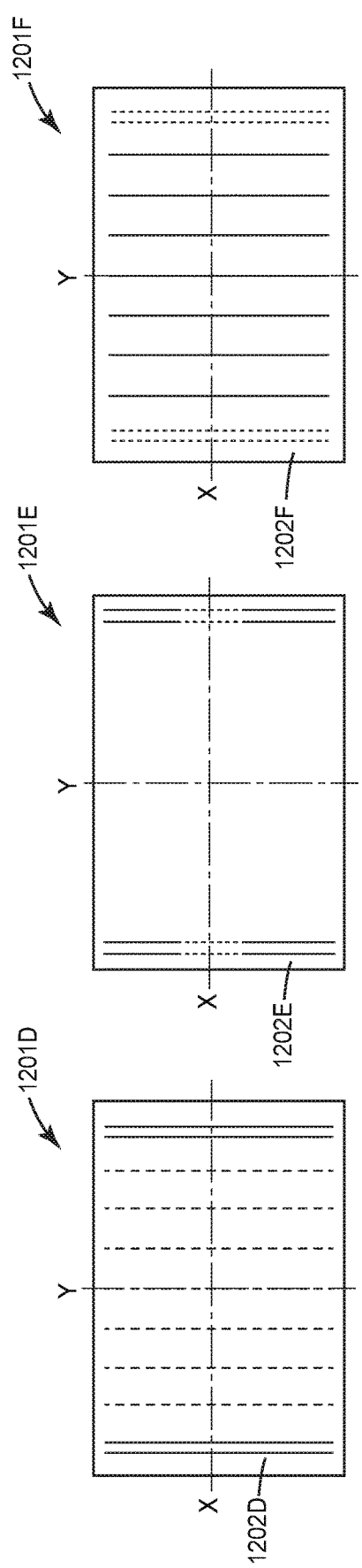

In FIGS. 15 and 16, the features 1000A are integral with the first film 1002 and the features 1000B are integral with the second film 1004. According to some embodiments, the features 1000A and 1000B can be configured (spaced and shaped) to be disengaged from one another so as to allow for a movement (e.g., a sliding motion) of the first film 1002 or the second film 1004 relative to one another in one or more of the longitudinal direction (corresponding to the x-axis direction shown) and/or the transverse direction (corresponding to the y-axis direction shown). For example, engagement of the features 1000A with the features 1000B to act as interlocking devices 1010 and/or curvature arresting features 1006 as shown in FIG. 16 can be facilitated by an initial movement (shown by arrow A1 in FIG. 15) of the first film 1002 relative to the second film 1004 in one of the transverse direction and the longitudinal direction to bring the features 1000A into engagement with the features 1000B as shown in FIG. 16. In some cases, disengagement of the features 1000A from the features 1000B is facilitated by a sequent movement (indicated by arrow A2 in FIG. 15) of the first film 1002 relative to the second film 1004 in a same one of the transverse direction and the longitudinal direction. In the disengaged position, the first film 1002 or second film 1004 could be moveable relative to one another (for example in additional directions such as perpendicular to the surface 1014) and features 1000A and 1000B may not be engaged so as to be curvature arresting.

More particularly, the features 1000A can comprise engagement elements 1016 and the features 1000B can comprise engagement elements 1018. The engagement element 1016 includes a stem 1020 and a cap 1022 that is wider than the stem 1020. The cross section of the engagement element 1016 is in a mushroom-like shape. Similarly, the engagement element 1018 includes a stem 1024 and a cap 1026 that is wider than the stem 1024. In some embodiments as illustrated in FIGS. 15 and 16, the engagement elements 1016 and/or 1018 are disposed with regular spacing. In some cases, the engagement elements 1016 and/or 1018 can form rows or gaps to allow or guide sliding of the first film and/or second film relative to one another as discussed above. The spacing of the rows of stems and the size of the caps can be selected to provide a desired degree of mechanical engagement along the direction generally perpendicular to the substrate and/or in one of the longitudinal direction or transverse direction, while still allowing sliding along the direction of the rows when in the disengaged in the manner described in reference to FIG. 15.

According to some embodiments, the caps, on the stems of one or both of the engagement elements 1016 and/or 1018 can have a shape other than generally round or mushroom shape shown in FIGS. 15 and 16. For example the caps on one or more engagement elements can be oblong or oval shaped. Suitable materials and configurations for this include those taught in U.S. Pat. Nos. 5,077,870 and 5,845,375 for round or mushroom shaped caps, as taught in U.S. Pat. No. 5,868,987 for oval or oblong shaped caps, and other configurations taught in U.S. Pat. No. 6,367,128, which are incorporated by reference in their entireties.

FIGS. 17A to 19F show example apparatuses 1101A, 1101B, 1101C, 1101D, 1101E, 1101F, 1201A, 1201B, 1201C, 1201D, 1201E, 1201F, 1301A, 1301B, 1301C, 1301D, 1301E and 1301F including films 1102A, 1102B, 1102C, 1102D, 1102E, 1102F, 1202A, 1202B, 1202C, 1202D, 1202E, 1202F, 1302A, 1302B, 1302C, 1302D, 1302E and 1302F and curvature arresting features and/or interlocking devices as previously illustrated and described. As shown in FIGS. 17A to 19F, the curvature arresting features and/or interlocking devices can be disposed in geometric patterns as desired. Unless otherwise noted, the curvature arresting features are shown by dashed lines and the interlocking devices are shown as solid lines in FIGS. 17A to 19F. Although a single film is shown in FIGS. 17A to 19F, it is understood multiple films with multiple layers of curvature arresting features and/or interlocking devices can be utilized. The geometric patterns shown are for exemplary purposes and are not the only geometric patterns contemplated. For example, the curvature arresting features and/or the interlocking devices can be arranged in a staggered manner in the transverse and/or longitudinal directions so as not to form the straight lines illustrated in FIGS. 17A to 19F.

FIGS. 17A to 17F show the apparatuses 1101A, 1101B, 1101C, 1101D, 1101E and 1101F with example dispositions for the curvature arresting features and/or interlocking devices. Each configuration of FIGS. 17A to 17F is configured to facilitate bending about the transverse axis (corresponding to the y-axis direction). This allows for arrest of a curvature of each of the apparatuses 1101A, 1101B, 1101C, 1101D, 1101E and 1101F in the longitudinal direction (corresponding to the x-axis direction). Additionally, the configurations of FIGS. 17A to 17F can facilitate relative motion of the films 1102A, 1102B, 1102C, 1102D, 1102E and 1102F relative to a second film (not shown) as previously described.

FIG. 17A illustrates the apparatus 1101A with interlocking devices 1110A alternated in the transverse direction (corresponding to the y-axis direction) with curvature arresting features 1106A.

The interlocking devices 1110A are disposed generally perpendicular to the bending direction Y. In some embodiments, at least two of the interlocking devices 1110A are generally parallel to each other and/or can have substantially equal spacing. Similarly, the curvature arresting features 1106A can be disposed generally perpendicular to the bending direction Y. In some embodiments, at least two of the curvature arresting features 1106A are generally parallel to each other and/or can have substantially equal spacing. Similar orientations and arrangements for the curvature arresting features and/or interlocking devices of other of FIGS. 17B-19F are contemplated but may not be explicitly described in some cases.

FIG. 17B shows another embodiment with interlocking devices 1110B and curvature arresting features 1106B. The pattern shown is a first set 1112B of interlocking devices 1110B generally parallel to each other, a set 1108B of curvature arresting features 1106B generally parallel to each other, and a second set 1114B of interlocking devices 1110B. The set 1108B of curvature arresting features 1106B is disposed between the first and second sets 1112B and 1114B of interlocking devices 1110B. The set 1108B of curvature arresting features 1106B can be disposed in a bending area to provide adequate bending flexibility but also curvature arrest for the apparatus 1101B in the longitudinal direction.

FIG. 17C shows another embodiment where apparatus 1101C uses features 1104C that can arrest the curvature of the apparatus 1101C in the longitudinal direction (bending about the y-axis). In some cases, the features 1104C can comprise both interlocking devices and curvature arresting features as discussed in reference to FIGS. 13-16.

FIG. 17D show the apparatus 1101D uses curvature arresting features 1106D disposed inside interlocking devices 1110D in the transverse direction. The interlocking devices 1110D comprise a first set 1112D of interlocking devices 1110D and a second set 1114D of interlocking devices 1110D. The first set 1112D of interlocking devices 1110D are disposed approximate to a first edge along y-axis direction of the film 1102D and the second set 1114D of interlocking devices 1110D are disposed approximate to a second edge along y-axis of the film 1102D. The first set 1112D of interlocking devices 1110D can include two generally parallel interlocking rails. The second set 1114D of interlocking devices 1110D can include two generally parallel interlocking rails.

FIG. 17E shows the apparatus 1101E having a similar construction to that of the apparatus 1101B. Thus, the apparatus 1101E includes curvature arresting features 1106E and interlocking devices 1110E. The interlocking devices 1110E comprise a first set 1112E of interlocking devices 1110E and a second set 1114E of interlocking devices 1110E. The first set 1112E of interlocking devices 1110E are disposed approximate to a first edge along y-axis of the film 1102E and the 1114E of interlocking devices 1110E are disposed approximate to a second edge along y-axis direction of the film 1102. The first set 1112E of interlocking devices 1110E can include two sections of interlocking segments disposed on either side of curvature arresting features 1106E in the x-axis direction.

FIG. 17F shows the apparatus 1101F having an inverted construction relative to that of the apparatus of FIG. 17D. Thus, the apparatus 1101F uses curvature arresting features 1106F disposed outside interlocking devices 1110F in the transverse direction. The curvature arresting features 1106F comprise a first set 1120F of curvature arresting features 1106F and a second set 1122F of curvature arresting features 1106F. The first set 1120F of curvature arresting features 1106F are disposed approximate to a first edge along y-axis direction of the film 1102F and the second set 1122F of curvature arresting features 1106F are disposed approximate to a second edge along y-axis of the film 1102F. The first set 1120F of curvature arresting features 1106F can include two generally parallel sets of features. The second set 1122F of curvature arresting features 1106F can include two generally parallel sets of features.

FIGS. 18A-18F show the arrangements of FIGS. 17A-17F, respectively, but with the interlocking devices and/or curvature arresting features rotated 90° in plan. Thus, for example, FIG. 18A corresponds to the embodiment of FIG. 17A but rotated 90° such that interlocking features and/or curvature arresting features have a relatively greater extent in the transverse direction than the longitudinal direction. The curvature arresting features can be configured to arrest the curvature of the apparatuses 1201A, 1201B, 1201C, 1201D, 1201E, 1201F, in the transverse direction (bending about the x-axis).

FIGS. 19A-19F show alternative embodiments with the apparatuses 1301A, 1301B, 1301C, 1301D, 1301E and 1301F configured with interlocking devices and/or curvature arresting features extending in both the longitudinal direction (x-axis direction) and the transverse direction (y-axis direction). Thus, curvature arresting features can be configured to arrest the curvature of the apparatuses 1301A, 1301B, 1301C, 1301D, 1301E, 1301F, in both the transverse direction (bending about the x-axis) and the longitudinal direction (bending about the y-axis).

Figure 20:
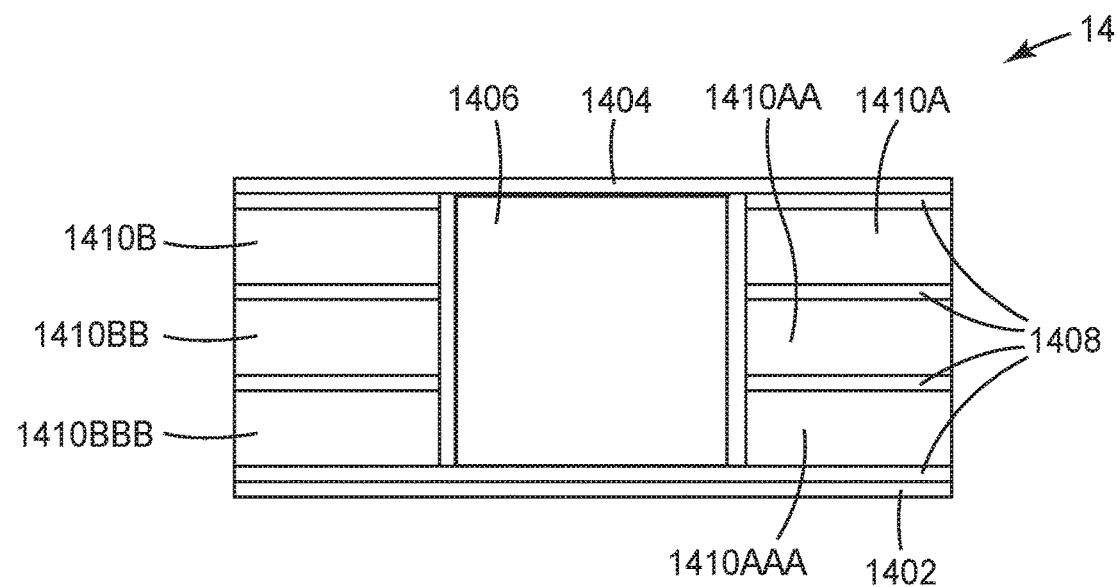
FIG. 20 is a plan view of an end of yet another apparatus having the plurality of components previously discussed in reference to FIGS. 1-2A but additionally including a stack of interlocking devices according to one embodiment of the present disclosure.

FIG. 20 shows yet another apparatus 1400 of similar construction to that of the apparatuses 100 and 200 of FIGS. 1-2A. Thus, the apparatus 1400 can include a first film 1402, a second film 1404, a plurality of curvature arresting features 1406 and an adhesive 1408 similar to those previously described in reference to FIGS. 1-2A. However, the apparatus 1400 differs from apparatuses 100 and 200 in that it utilizes a plurality of interlocking devices 1410A, 1410AA, 1410AAA, 1410B, 1410BB and 1410BB. The interlocking devices 1410A, 1410AA and 1410AAA are arranged as a stack 1412A that includes the adhesive 1408 between each of the interlocking devices 1410A, 1410AA and 1410AAA. Similarly, the interlocking devices 1410B, 1410BB and 1410BBB are arranged as a stack 1412B that includes the adhesive 1408 between each of the interlocking devices 1410B, 1410BB and 1410BBB.

Working Example 6 discusses a specific embodiment of FIG. 20 utilizing specific materials, curvature arresting feature design, and the like.

Figure 21:
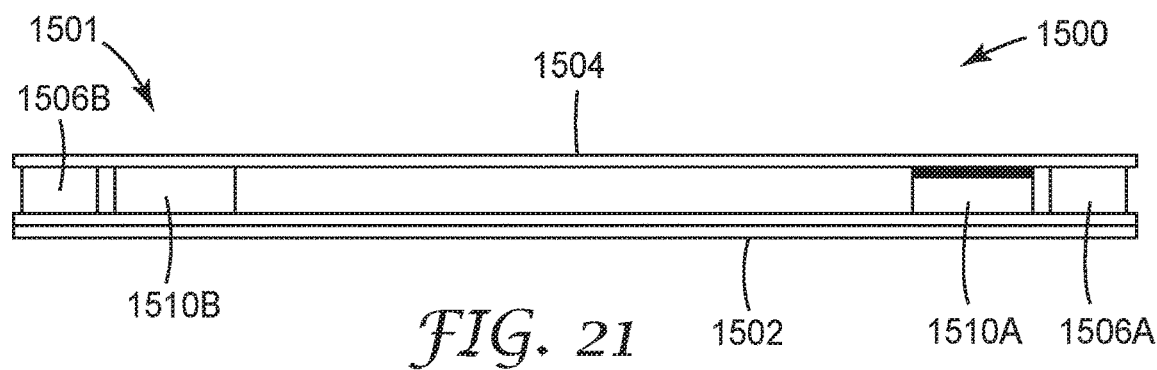
FIG. 21 is an example of another apparatus that can be used as part of an electronic device according to one embodiment of the present disclosure.

FIG. 21 shows an arrangement for an apparatus 1500 that could be used with an electronic device 1501. As shown in FIG. 21, curvature arresting features 1506A and 1506B such as those previously illustrated and described can be disposed in the transverse (or longitudinal) direction outside the viewing area. However, in instances where the curvature arresting features 1506A and 1506B are optically clear they may be disposed in the viewing area.

Figure 22:
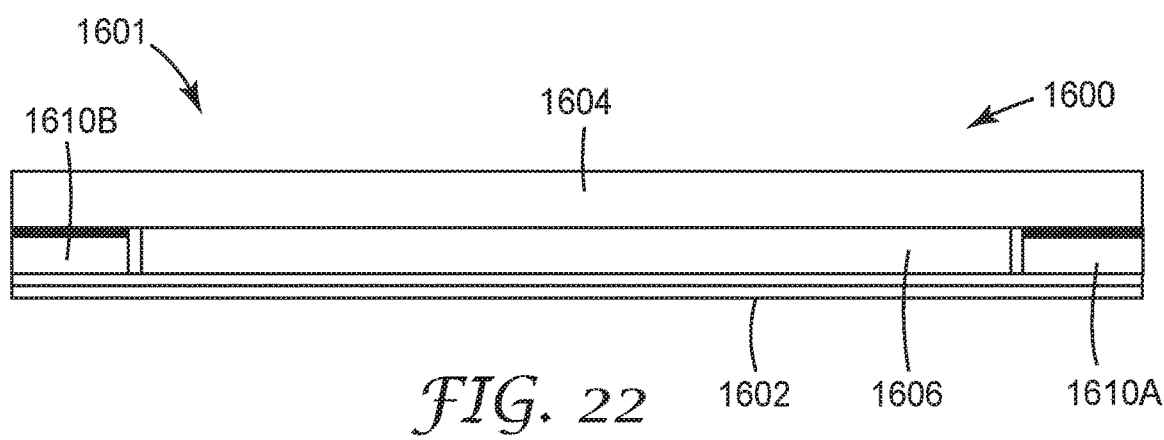
FIG. 22 is another example of an apparatus that can be used as part of an electronic device according to one embodiment of the present disclosure.

As shown in the embodiment of FIG. 21, the curvature arresting features 1506A and 1506B can be in a spaced relationship from one another. In other embodiments, the curvature arresting features can be disposed behind the viewing area such as shown in the embodiment of FIG. 22. The apparatus 1500 can also include interlocking devices 1510A and 1510B such as those previously illustrated and described. These can be disposed in the transverse (or longitudinal) direction outside the viewing area. In other embodiments, the interlocking devices 1510A and 1510B can be disposed behind the viewing area. Various electronics components including for example protective films, touch sensor components, barrier film components, polarizers, optical filter components, diffuser components, light emissive components, active or passive matrix backplane components, optically clear adhesives, and/or heat spreading layers, can be disposed transversely (or longitudinally) between the interlocking devices 1510A and 1510B and/or the curvature arresting features 1506A and 1506A.

As previously described, the interlocking devices 1510A and 1510B and/or the curvature arresting features 1506A and 1506A can be attached to or integral with films 1502 and 1504. The films 1502 and/or 1504 can comprise the electronics components described previously, for example. In some cases, multiple layers of interlocking devices 1510A and 1510B and/or the curvature arresting features 1506A and 1506A can be utilized as illustrated and described in prior embodiments (e.g., FIGS. 2, 2A and 20).

FIG. 22 shows another embodiment of an apparatus 1600 that could be used with an electronic device 1601. As shown in FIG. 22, curvature arresting features 1606 are disposed behind the viewing area beneath various electronics components (discussed in reference to FIG. 21) such as the display. Interlocking devices 1610A and 1610B such as those previously described can be utilized in some embodiments. As previously described with reference to FIG. 21, the interlocking devices 1610A and 1610B and/or the curvature arresting features 1606 can be attached to or integral with films 1602 and 1604. The films 1602 and/or 1604 can comprise the electronics components described previously, for example.

The flexible films described previously can also be disposed immediately adjacent to a rigid member to provide mechanical stiffness in use. Although this is not the case in all embodiments due to the curvature arresting features. As an example, the rigid member may also be a part of a heat sink, battery, electromagnetic shielding, or other components for a display panel. The electronic device can include a plurality of neutral planes that are not subject to substantial curvature due to the constructions of the apparatuses described herein.

Thus, the electronic devices shown can include one or more apparatuses that can be configured as previously described to include curvature arresting features and/or interlocking devices. The apparatuses can be disposed between various of the components of the electronic device (e.g., between an OLED and a backplane, between an encapsulation and the OLED, between a cover plate and a touch panel, or the like. The arrangement of the apparatuses in the electronic device can determine the location of the neutral planes within the device.

Definitions

The term "a", "an", and "the" are used interchangeably with "at least one" to mean one or more of the elements being described.

The term "and/or" means either or both. For example "A and/or B" means only A, only B, or both A and B.

The terms "including," "comprising," or "having," and variations thereof, are meant to encompass the items listed thereafter and equivalents thereof as well as additional items.

Unless specified or limited otherwise, the term "coupled" and variations thereof are used broadly and encompass both direct and indirect couplings.

The terms "front," "rear," "top," "bottom," and the like are only used to describe elements as they relate to one another, but are in no way meant to recite specific orientations of the apparatus, to indicate or imply necessary or required orientations of the apparatus, or to specify how the invention described herein will be used, mounted, displayed, or positioned in use.

As used herein, when an element, component or layer for example is described as being "on" "connected to," "coupled to" or "in contact with" another element, component or layer, it can be directly on, directly connected to, directly coupled with, in direct contact with, or intervening elements, components or layers may be on, connected, coupled or in contact with the particular element, component or layer, for example. When a film, element, component or layer for example is referred to as being "directly on," "directly connected to," "directly coupled to," or "directly in contact with" another element, there are no intervening elements, components or layers for example A "predetermined magnitude" in reference to an applied force means that stiffening of an article's response to the applied force is achieved to a limit to the strain in the article. In reference to FIG. 23, means a magnitude of an applied force is sufficient to cause a degree of curvature for the apparatus at which at least some of the curvature arresting features provide stiffening to the apparatus. If gaps are utilized with the curvature arresting features stiffening can occur when come into contact with one another (e.g., a gap no longer exists between at least some of the curvature arresting features). This is indicated as vertical line V. It is the point in the plot of FIG. 23 where the force v. displacement plot enters Zone III.

The term "arrest" means in a physical manner, to increase the increment of force (stiffness) required to provide additional deformation to an object. In reference to FIG. 23, "arrest" begins to occur at vertical line V, at the point where the degree of curvature for the apparatus is sufficient to cause at least some of the curvature arresting features provide stiffening to the apparatus. Arrest occurs for the duration of Zone III in the plot of FIG. 23.

As used herein a "curvature arresting feature" means a component such as a layer designed to increase a stiffness of an article in at least one direction upon the article reaching a desired amount of curvature. Put another way, the "curvature arresting feature" also acts as a strain arresting feature to substantially slow an elastic strain of the apparatus once a predetermined degree of curvature for the apparatus is reached.

The phrase "the center of the radius of curvature" is used to refer to the center of a circle tangent to two adjacent center points of two line segments of the top of a curvature arresting feature in total or partial contact with each other at the upper surface.

The phrases "film," "layer" "sheet" or variations thereof, are used to describe an article having a thickness that is small relative to its length and width. Such length and width and be measured in a transverse direction and a longitudinal direction in some cases. The length and width of such articles can define a "surface" or "major surface" of the article, but this major surface, as well as the article, need not be flat or planar. For example, the above phrases can be used to describe an article having a first ratio (R1) of thickness (e.g., in a Z direction that is orthogonal to a major surface of the article at any point along the major surface) to a first surface dimension of the major surface (e.g., width or length), and a second ratio (R2) of thickness to a second surface dimension of the major surface, where the first ratio (R1) and the second ratio (R2) are both less than 0.1. In some embodiments, the first ratio (R1) and the second ratio (R2) can be less than 0.01; in some embodiments, less than 0.001; and in some embodiments, less than 0.0001. Note that the two surface dimensions need not be the same, and the first ratio (R1) and the second ratio (R2) need not be the same, in order for both the first ratio (R1) and the second ratio (R2) to fall within the desired range. In addition, none of the first surface dimension, the second surface dimension, the thickness, the first ratio (R1), and the second ratio (R2) need to be constant in order for both the first ratio (R1) and the second ratio (R2) to fall within the desired range.

The phrase "major surface" or simply "surface" is used to refer to a collective surface of the article (e.g., an outer surface of the article) as measured in various directions including the longitudinal direction and the transverse direction, even if the article is formed of smaller objects or portions. The smaller objects and portions can collectively define a major surface of the article. While such a major surface can be planar in some instances, the major surface need not be flat or planar, and in some cases, can be curved or otherwise complex.

The terms "substantially" or "generally" or the like means no greater than 10% of deviation according to some embodiments; in some embodiments, no greater than 5%; in some embodiments, no greater than 2%; and in some embodiments, no greater than 1%.

The phrase "substantially parallel" or "parallel" is used to refer to the relative orientation of at least two films or at least two features, etc. where the major surface of the films or surfaces of the features are oriented parallel with respect to one another at any point along their respective surfaces, but allowing for a slight deviation from parallel. For example, if two films have major surfaces that lie in an X-Y plane and are spaced a distance apart in a Z direction that is orthogonal, or normal, to the X-Y plane, the two films can be considered substantially parallel even if one or both of the sheets has a major surface that is oriented slightly out of an orthogonal relationship with the Z direction at a given point, or area, along the major surface. In some embodiments, the two films can be substantially parallel if one or both of the films has a major surface that extends in the Z direction by an amount (i.e., has a Z dimension because the major surface is tilted with respect to the Z direction) that is no greater than 10% of its dimensions in the X-Y plane; in some embodiments, no greater than 5%; in some embodiments, no greater than 2%; and in some embodiments, no greater than 1%. Note that two films can still be substantially parallel even if the sheets are not flat or planar. For example, two curved films can be substantially parallel if the two films are curved to the same degree and in the same way so that the orientation of the major surfaces of the two films, relative to a normal direction at any point, or area, along the major surface, still falls within the above ranges.

VARIOUS NOTES & EXAMPLES

In Example 1, an apparatus can optionally include:
a flexible first film having an extent in both a longitudinal direction and a transverse direction; a second film at least partially interfacing the first film and having an extent in both the longitudinal and the transverse direction; and a first plurality of features disposed between the first film and the second film, can optionally include the first plurality of features have an extent in both the transverse direction and the longitudinal direction, and can optionally include at least some of the first plurality of features are spaced apart from one another by a gap when the first film is not subject to an applied bending force or is subject to the applied bending force below a predetermined magnitude in one or both of the transverse direction and the longitudinal direction, and can optionally include the at least some of the first plurality of features contact one another to arrest a curvature of the first film in one or both of the transverse direction and the longitudinal direction when the applied bending force is at or above the predetermined magnitude; can optionally include the second film is moveable relative to the first film in at least one of the longitudinal direction or transverse direction.

In Example 2, the apparatus of Example 1 can optionally comprise the first plurality of features comprises one or more of a curvature arresting feature and an interlocking device that comprise one or more of rails, channels, caps and stems.

In Example 3, the apparatus of Example 2, can optionally include the first plurality of features comprise one or more of thermoplastic or thermosetting polymers, polymer composites, metals or ceramics.

In Example 4, the apparatus of any one or any combination of Examples 1-3, can optionally include the first plurality of features are arranged in a geometric pattern.

In Example 5, the apparatus of any one or any combination of Examples 1-4, can optionally include the first plurality of features have substantially a same size.

In Example 6, the apparatus of any one or any combination of Examples 1-5, can optionally include the gap comprises 0.050 mm to 10 mm, inclusive.

In Example 7, the apparatus of any one or any combination of Examples 1-6, can optionally include the gap has a first ratio of a width to that of one of the first plurality of features between 0.1 and 10, inclusive, and can optionally include the gap has a second ratio to that of a thickness of the one of the first plurality of features between 0.1 and 1, inclusive.

In Example 8, the apparatus of any one or any combination of Examples 1-7, can optionally include the first plurality of features are attached to or integrated with the first film.

In Example 9, the apparatus of any one or any combination of Examples 1-8, can optionally include the plurality of features have one of a substantially trapezoidal shape in cross-section or a chamfered rectangular shape in cross-section.

In Example 10, the apparatus of any one or any combination of Examples 1-9, can optionally include at least two of the first plurality of features include both a major surface and a side surface that extends from the major surface to the surface of the first film, and can optionally include the side surface of the first of the at least two of the first plurality of features is configured to engage the side surface of the second of the at least two of the first plurality of features to arrest the curvature of the first film.

In Example 11, the apparatus of any one or any combination of Examples 1-10, can optionally include one or more of the first plurality of features have one of a shape or orientation to provide for a desired degree of curvature for the first film.

In Example 12, the apparatus of any one or any combination of Examples 1-11, can optionally include at least some of the first plurality of features are configured to interlock with others of the at least some of the first plurality of features during the curvature of the first film to maintain the curvature of the first film at a desired degree in an absence of the applied bending force.

In Example 13, the apparatus of any one or any combination of Examples 1-12, further comprising:

a second plurality of interlocking devices attached to or integral with the second film;

can optionally include one or more of the first plurality of features comprise a first plurality of interlocking devices that are configured to engage the second plurality of interlocking devices, and can optionally include when the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible.

In Example 14, the apparatus of Example 13, can optionally include separation of the first film from the second film in a direction generally perpendicular to the surface of the first film is prevented by engagement of the first plurality of interlocking devices with the second plurality of interlocking devices.

In Example 15, the apparatus of any one or any combination of Examples 13-14, can optionally include the second plurality of interlocking devices project from a surface of the second film, can optionally include the second plurality of interlocking devices have an extent in both the transverse direction and the longitudinal direction, and can optionally include at least some of the second plurality of interlocking devices are spaced apart from one another by a second gap when the second film is not subject to the applied bending force or is subject to the applied bending force below the predetermined magnitude in one or both of the transverse direction and the longitudinal direction, and can optionally include the at least some of the second plurality of interlocking features contact one another and/or the first plurality of features to arrest a curvature of the second film in one or both of the transverse direction and the longitudinal direction when the applied bending force is at or above the predetermined magnitude.

In Example 16, the apparatus of any one or any combination of Examples 13-15, can optionally include engagement of the first plurality of interlocking devices with the second plurality of interlocking devices is facilitated by an initial movement of the first film relative to the second film in one of the transverse direction and the longitudinal direction, and can optionally include disengagement of the first plurality of interlocking devices from the second plurality of interlocking devices is facilitated by a sequent movement of the first film relative to the second film in a same one of the transverse direction and the longitudinal direction.

In Example 17, the apparatus of any one or any combination of Examples 13-15, can optionally include the first plurality of interlocking devices and the second interlocking devices comprise engagement rails that form a sliding channel.

In Example 18, the apparatus of any one or any combination of Examples 1-12, further comprising:

a first plurality of interlocking devices attached to or integral with the first film and spaced from the first plurality of features in at least one of the transverse direction and the longitudinal direction;

a second plurality of interlocking devices attached to or integral with the second film;

can optionally include the first plurality of interlocking devices are configured to engage the second plurality of interlocking devices, and can optionally include when the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible.

In Example 19, the apparatus of Example 18, can optionally include separation of the first film from the second film in a direction generally perpendicular to the surface of the first film is prevented by engagement of the first plurality of interlocking devices with the second plurality of interlocking devices.

In Example 20, the apparatus of any one or any combination of Examples 18-19, further comprising a second plurality of features that project from a surface of the second film, can optionally include the second plurality of features have an extent in both the transverse direction and the longitudinal direction, and can optionally include at least some of the second plurality of features are spaced apart from one another by a second gap when the second film is not subject to the applied bending force or is subject to the applied bending force below the predetermined magnitude in one or both of the transverse direction and the longitudinal direction, and can optionally include the at least some of the second plurality of features contact one another and/or the first plurality of features to arrest a curvature of the first film in one or both of the transverse direction and the longitudinal direction when the applied bending force is at or above the predetermined magnitude.

In Example 21, the apparatus of any one or any combination of Examples 18-20, can optionally include engagement of the first plurality of interlocking devices with the second plurality of interlocking devices is facilitated by an initial movement of the first film relative to the second film in one of the transverse direction and the longitudinal direction, and can optionally include disengagement of the first plurality of interlocking devices with the second plurality of interlocking devices is facilitated by a sequent movement of the first film relative to the second film in a same one of the transverse direction and the longitudinal direction.

In Example 22, the apparatus of any one or any combination of Examples 18-21, can optionally include the first plurality of interlocking devices and the second interlocking devices comprise engagement rails that form a sliding channel.

In Example 23, the apparatus of any one or any combination of Examples 1-22, further comprising an optical coupler disposed between the first film and the second film, can optionally include the optical coupler is a liquid, adhesive, gel, or a combination thereof.

In Example 24, the apparatus of Example 23, can optionally include the optical coupler has a refractive index having an absolute difference less than or equal to 0.05 from a refractive index of the first plurality of features.

In Example 25, the apparatus of any one or any combination of Examples 1-24, can optionally include the apparatus comprises a part of an electronic device and/or a wearable device.

In Example 26, the apparatus of any one or any combination of Examples 1-25, can optionally include the first plurality of features configured to provide the apparatus with a first stiffness at a desired degree of curvature in one of the transverse direction and the longitudinal direction, while being configured to provide the apparatus with a second stiffness at the same desired degree of curvature in the other of the transverse direction and the longitudinal direction, and can optionally include the first stiffness differs from the second stiffness.

In Example 27, the apparatus of any one or any combination of Examples 1-26, can optionally include the first plurality of features are optically clear.

In Example 28, the apparatus of any one or any combination of Examples 1-27, can optionally include one or both of the first film and the second film comprises at least one of a single layer or a plurality of layers.

In Example 29, the apparatus of any one or any combination of Examples 1-28, can optionally include the second film comprises a rigid component.

In Example 30, the apparatus of any one or any combination of Examples 1-28, can optionally include the second film comprises a different material than the first film.

In Example 31, the apparatus of any one or any combination of Examples 1-29, can optionally include the first plurality of features are disposed on both a first major surface of the first film and a second major surface of the first film.

In Example 32, an apparatus can optionally include comprising:

a flexible first film having an extent in both a longitudinal direction and a transverse direction; a second film at least partially interfacing the first film and having an extent in both the longitudinal and the transverse direction; a first plurality of curvature arresting features disposed between the first film and the second film, can optionally include the first plurality of curvature arresting features have an extent in both the transverse direction and the longitudinal direction and extend from a surface of the first film, and can optionally include at least some of the first plurality of curvature arresting features are spaced apart from one another by a gap when the first film is not subject to an applied bending force or is subject to the applied bending force below a predetermined magnitude in one or both of the transverse direction and the longitudinal direction, and can optionally include the at least some of the first plurality of curvature arresting features contact one another to arrest a curvature of the first film in one or both of the transverse direction and the longitudinal direction when the applied bending force is at or above the predetermined magnitude; a first plurality of interlocking devices attached to or integral with the first film; and a second plurality of interlocking devices attached to or integral with the second film; can optionally include first plurality of interlocking devices are configured to engage the second plurality of interlocking devices, and can optionally include when the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible.

In Example 33, the apparatus of Example 32, can optionally include the first and second interlocking devices comprise one or more of rails, channels, caps and stems.

In Example 34, the apparatus of Example 33, can optionally include the first plurality of curvature arresting features comprise one or more of thermoplastic or thermosetting polymers, polymer composites, metals or ceramics In Example 35, the apparatus of any one or any combination of Examples 32-34, can optionally include the first plurality of curvature arresting features are arranged in a geometric pattern.

In Example 36, the apparatus of any one or any combination of Examples 32-35, can optionally include the first plurality of curvature arresting features have substantially a same size.

In Example 37, the apparatus of any one or any combination of Examples 32-36, can optionally include the gap comprises 0.050 mm to 10 mm, inclusive.

In Example 38, the apparatus of any one or any combination of Examples 32-37, can optionally include the gap has a first ratio to that of a width of one of first plurality of curvature arresting features between 0.1 and 10, inclusive, and can optionally include the gap has a second ratio to that of a thickness of the first plurality of curvature arresting features between 0.1 and 1, inclusive.

In Example 39, the apparatus of any one or any combination of Examples 32-38, can optionally include the first plurality of curvature arresting features are attached to or integrated with the first film.

In Example 40, the apparatus of any one or any combination of Examples 32-39, can optionally include the plurality of curvature arresting features have one of a substantially trapezoidal shape in cross-section or a chamfered rectangular shape in cross-section.

In Example 41, the apparatus of any one or any combination of Examples 32-40, can optionally include at least two of the first plurality of curvature arresting features include both a major surface and a side surface that extends from the major surface to the surface of the first film, and can optionally include the side surface of the first of the at least two of the first plurality of curvature arresting features is configured to engage the side surface of the second of the at least two of the first plurality of curvature arresting features to arrest the curvature of the first film.

In Example 42, the apparatus of any one or any combination of Examples 32-41, can optionally include one or more of the first plurality of curvature arresting features have one of a shape or orientation to provide for a desired degree of curvature for the first film.

In Example 43, the apparatus of any one or any combination of Examples 32-42, can optionally include at least some of the first plurality of curvature arresting features are configured to interlock with others of the at least some of the first plurality of curvature arresting features during the curvature of the first film to maintain the curvature of the first film at a desired degree in an absence of the applied bending force.

In Example 44, the apparatus of any one or any combination of Examples 32-43, can optionally include separation of the first film from the second film in a direction generally perpendicular to the surface of the first film is prevented by engagement of the first plurality of interlocking devices with the second plurality of interlocking devices.

In Example 45, the apparatus of any one or any combination of Examples 32-44, can optionally include at least some of the second plurality of interlocking devices are spaced apart from one another by a second gap when the second film is not subject to the applied bending force or is subject to the applied bending force below the predetermined magnitude in one or both of the transverse direction and the longitudinal direction, and can optionally include the at least some of the second plurality of interlocking features contact one another to arrest a curvature of the second film in one or both of the transverse direction and the longitudinal direction when the applied bending force is at or above the predetermined magnitude.

In Example 46, the apparatus of any one or any combination of Examples 32-45, further comprising a second plurality of curvature arresting features attached to or integrated with the second film, can optionally include the second plurality of curvature arresting features have an extent in both the transverse direction and the longitudinal direction, and can optionally include at least some of the second plurality of curvature arresting features are spaced apart from one another by a second gap when the second film is not subject to an applied bending force or is subject to the applied bending force below a predetermined magnitude in one or both of the transverse direction and the longitudinal direction, and can optionally include the at least some of the second plurality of curvature arresting features contact one another and/or the first plurality of curvature arresting features to arrest a curvature of the first film in one or both of the transverse direction and the longitudinal direction when the applied bending force is at or above the predetermined magnitude.

In Example 47, the apparatus of any one or any combination of Examples 32-46, can optionally include engagement of the first plurality of interlocking devices with the second plurality of interlocking devices is facilitated by an initial movement of the first film relative to the second film in one of the transverse direction and the longitudinal direction, and can optionally include disengagement of the first plurality of interlocking devices from the second plurality of interlocking devices is facilitated by a sequent movement of the first film relative to the second film in a same one of the transverse direction and the longitudinal direction.

In Example 48, the apparatus of any one or any combination of Examples 32-47, can optionally include the first plurality of interlocking devices and the second interlocking devices comprise engagement rails that form a sliding channel.

In Example 49, the apparatus of any one or any combination of Examples 32-48, further comprising an optical coupler disposed between the first film and the second film, can optionally include the optical coupler is a liquid, adhesive, gel, or a combination thereof.

In Example 50, the apparatus of Example 49, can optionally include the optical coupler has a refractive index having an absolute difference less than or equal to 0.05 from a refractive index of the first plurality of curvature arresting features.

In Example 51, the apparatus of any one or any combination of Examples 32-50, can optionally include the apparatus comprises a part of an electronic device and/or a wearable device.

In Example 52, the apparatus of any one or any combination of Examples 32-51, can optionally include the first plurality of curvature arresting features configured to provide the apparatus with a first stiffness at a desired degree of curvature in one of the transverse direction and the longitudinal direction, while being configured to provide the apparatus with a second stiffness at the same desired degree of curvature in the other of the transverse direction and the longitudinal direction, and can optionally include the first stiffness differs from the second stiffness.

In Example 53, the apparatus of any one or any combination of Examples 32-52, can optionally include the first plurality of curvature arresting features are optically clear.

In Example 54, the apparatus of any one or any combination of Examples 32-53, can optionally include one or both of the first film and the second film comprises at least one of a single layer or a plurality of layers.

In Example 55, the apparatus of any one or any combination of Examples 32-54, can optionally include the second film comprises a rigid component.

In Example 56, the apparatus of any one or any combination of Examples 32-55, can optionally include the second film comprises a different material than the first film.

In Example 57, the apparatus of any one or any combination of Examples 32-56, can optionally include the first plurality of curvature arresting features are disposed on both a first major surface of the first film and a second major surface of the first film.

In Example 58, an apparatus can optionally include comprising:

a flexible first film having an extent in both a longitudinal direction and a transverse direction; a second film at least partially interfacing the first film and having an extent in both the longitudinal and the transverse direction; and a first plurality of curvature arresting features disposed between the first film and the second film, can optionally include the first plurality of features have an extent in both the transverse direction and the longitudinal direction and are substantially trapezoidal in shape in cross-section, and can optionally include at least some of the first plurality of features are configured to engage one another to arrest a curvature of the first film in one or both of the transverse direction and the longitudinal direction when an applied bending force is at or above the predetermined magnitude; can optionally include the second film is moveable relative to the first film in at least one of the longitudinal direction or transverse direction.

In Example 59, the apparatus of Example 58, can optionally include the plurality of curvature arresting features comprise one or more of thermoplastic or thermosetting polymers, polymer composites, metals or ceramics In Example 60, the apparatus of any one or any combination of Examples 58-60, can optionally include the first plurality of curvature arresting features are arranged in a geometric pattern.

In Example 61, the apparatus of any one or any combination of Examples 58-60, can optionally include the first plurality of curvature arresting features have substantially a same size.

In Example 62, the apparatus of any one or any combination of Examples 58-61, can optionally include at least some of the first plurality of curvature arresting features are spaced apart from one another by a gap when the first film is not subject to an applied bending force or is subject to the applied bending force below a predetermined magnitude in one or both of the transverse direction and the longitudinal direction, can optionally include the at least some of the first plurality of curvature arresting features contact one another to arrest a curvature of the first film in one or both of the transverse direction and the longitudinal direction when the applied bending force is at or above the predetermined magnitude, and can optionally include the gap comprises 0.050 mm to 10 mm, inclusive.

In Example 63, the apparatus of Example 62, can optionally include the gap as first ratio to that of a width of one of the first plurality of curvature arresting features between 0.1 and 10, inclusive, and can optionally include the gap has a second ratio to that of a thickness of the one of the first plurality of curvature arresting features between 0.1 and 1, inclusive.

In Example 64, the apparatus of any one or any combination of Examples 58-63, can optionally include the first plurality of curvature arresting features are attached to or integrated with the first film.

In Example 65, the apparatus of any one or any combination of Examples 58-64, can optionally include at least two of the first plurality of curvature arresting features include both a major surface and a side surface that extends from the major surface to the surface of the first film, and can optionally include the side surface of the first of the at least two of the first plurality of curvature arresting features is configured to engage the side surface of the second of the at least two of the first plurality of curvature arresting features to arrest the curvature of the first film.

In Example 66, the apparatus of any one or any combination of Examples 58-65, can optionally include one or more of the first plurality of curvature arresting features have one of a shape or orientation to provide for a desired degree of curvature for the first film.

In Example 67, the apparatus of any one or any combination of Examples 58-66, can optionally include at least some of the first plurality of curvature arresting features are configured to interlock with others of the at least some of the first plurality of curvature arresting features during the curvature of the first film to maintain the curvature of the first film at a desired degree in an absence of the applied bending force.

In Example 68, the apparatus of any one or any combination of Examples 58-67, can optionally include separation of the first film from the second film in a direction generally perpendicular to the surface of the first film is prevented by engagement of the first plurality of interlocking devices with the second plurality of interlocking devices.

In Example 69, the apparatus of any one or any combination of Examples 58-68, further comprising:

a first plurality of interlocking devices attached to or integral with the first film a second plurality of interlocking devices attached to or integral with the second film; can optionally include the first plurality of interlocking devices that are configured to engage the second plurality of interlocking devices, and can optionally include when the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible.

In Example 70, the apparatus of Example 69, can optionally include separation of the first film from the second film in a direction generally perpendicular to the surface of the first film is prevented by engagement of the first plurality of interlocking devices with the second plurality of interlocking devices.

In Example 71, the apparatus of any one or any combination of Examples 68-69, can optionally include the second plurality of interlocking devices project from a surface of the second film, can optionally include the second plurality of interlocking devices have an extent in both the transverse direction and the longitudinal direction, and can optionally include at least some of the second plurality of interlocking devices are spaced apart from one another by a second gap when the second film is not subject to the applied bending force or is subject to the applied bending force below the predetermined magnitude in one or both of the transverse direction and the longitudinal direction, and can optionally include the at least some of the second plurality of interlocking features contact one another and/or the first plurality of features to arrest a curvature of the second film in one or both of the transverse direction and the longitudinal direction when the applied bending force is at or above the predetermined magnitude.

In Example 72, the apparatus of any one or any combination of Examples 68-70, can optionally include engagement of the first plurality of interlocking devices with the second plurality of interlocking devices is facilitated by an initial movement of the first film relative to the second film in one of the transverse direction and the longitudinal direction, and can optionally include disengagement of the first plurality of interlocking devices from the second plurality of interlocking devices is facilitated by a sequent movement of the first film relative to the second film in a same one of the transverse direction and the longitudinal direction.

In Example 73, the apparatus of any one or any combination of Examples 68-72, can optionally include the first plurality of interlocking devices and the second interlocking devices comprise engagement rails that form a sliding channel.

In Example 74, the apparatus of any one or any combination of Examples 58-73, further comprising an optical coupler disposed between the first film and the second film, can optionally include the optical coupler is a liquid, adhesive, gel, or a combination thereof.

In Example 75, the apparatus of Example 74, can optionally include the optical coupler has a refractive index having an absolute difference less than or equal to 0.05 from a refractive index of the first plurality of curvature arresting features.

In Example 76, the apparatus of any one or any combination of Examples 58-75, can optionally include the first plurality of curvature arresting features configured to provide the apparatus with a first stiffness at a desired degree of curvature in one of the transverse direction and the longitudinal direction, while being configured to provide the apparatus with a second stiffness at the same desired degree of curvature in the other of the transverse direction and the longitudinal direction, and can optionally include the first stiffness differs from the second stiffness.

In Example 77, the apparatus of any one or any combination of Examples 58-76, can optionally include the first plurality of curvature arresting features are optically clear.

In Example 78, the apparatus of any one or any combination of Examples 58-77, can optionally include one or both of the first film and the second film comprises at least one of a single layer or a plurality of layers.

In Example 79, the apparatus of any one or any combination of Examples 58-78, can optionally include the second film comprises a rigid component.

In Example 80, the apparatus of any one or any combination of Examples 58-79, can optionally include the second film comprises a different material than the first film.

In Example 81, the apparatus of any one or any combination of Examples 58-80, can optionally include the first plurality of curvature arresting features are disposed on both a first major surface of the first film and a second major surface of the first film.

In Example 82, an apparatus can optionally include comprising:
a flexible first film having an extent in both a longitudinal direction and a transverse direction; a second film at least partially interfacing the first film and having an extent in both the longitudinal and the transverse direction; and a first plurality of curvature arresting features disposed between the first film and the second film, can optionally include the first plurality of features have an extent in both the transverse direction and the longitudinal direction, and can optionally include at least some of the first plurality of features are configured to engage and interlock with others of the at least some of the first plurality of features during a curvature of the first film in one or both of the transverse direction and the longitudinal direction to maintain the curvature of the first film at a desired degree; can optionally include the second film is moveable relative to the first film in at least one of the longitudinal direction or transverse direction.

In Example 83, the apparatus of Example 82, can optionally include the plurality of curvature arresting features comprise one or more of thermoplastic or thermosetting polymers, polymer composites, metals or ceramics In Example 84, the apparatus of any one or any combination of Examples 82-83, can optionally include the first plurality of curvature arresting features are arranged in a geometric pattern.

In Example 85, the apparatus of any one or any combination of Examples 82-84, can optionally include the first plurality of curvature arresting features have substantially a same size.

In Example 86, the apparatus of any one or any combination of Examples 82-85, can optionally include at least some of the first plurality of curvature arresting features are spaced apart from one another by a gap when the first film is not subject to an applied bending force or is subject to the applied bending force below a predetermined magnitude in one or both of the transverse direction and the longitudinal direction, can optionally include the at least some of the first plurality of curvature arresting features contact one another to arrest a curvature of the first film in one or both of the transverse direction and the longitudinal direction when the applied bending force is at or above the predetermined magnitude, and can optionally include the gap comprises 0.050 mm to 10 mm, inclusive.

In Example 87, the apparatus of Example 86, can optionally include the gap as first ratio to that of a width of one of first plurality of curvature arresting features between 0.1 and 10, inclusive, and can optionally include the gap has a second ratio to that of a thickness of the one of first plurality of curvature arresting features between 0.1 and 1, inclusive.

In Example 88, the apparatus of any one or any combination of Examples 82-87, can optionally include the first plurality of curvature arresting features are attached to or integrated with the first film.

In Example 89, the apparatus of any one or any combination of Examples 82-88, can optionally include at least two of the first plurality of curvature arresting features include both a major surface and a side surface that extends from the major surface to the surface of the first film, and can optionally include the side surface of the first of the at least two of the first plurality of curvature arresting features is configured to engage the side surface of the second of the at least two of the first plurality of curvature arresting features to arrest the curvature of the first film.

In Example 90, the apparatus of any one or any combination of Examples 82-89, can optionally include one or more of the first plurality of curvature arresting features have one of a shape or orientation to provide for a desired degree of curvature for the first film.

In Example 91, the apparatus of any one or any combination of Examples 82-90, can optionally include the plurality of curvature arresting features have one of a substantially trapezoidal shape in cross-section or a chamfered rectangular shape in cross-section.

In Example 92, the apparatus of any one or any combination of Examples 82-91, can optionally include separation of the first film from the second film in a direction generally perpendicular to the surface of the first film is prevented by engagement of the first plurality of interlocking devices with the second plurality of interlocking devices.

In Example 93, the apparatus of any one or any combination of Examples 82-92, further comprising:
a first plurality of interlocking devices attached to or integral with the first film
a second plurality of interlocking devices attached to or integral with the second film; can optionally include the first plurality of interlocking devices that are configured to engage the second plurality of interlocking devices, and can optionally include when the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible.

In Example 94, the apparatus of Example 93, can optionally include separation of the first film from the second film in a direction generally perpendicular to the surface of the first film is prevented by engagement of the first plurality of interlocking devices with the second plurality of interlocking devices.

In Example 95, the apparatus of any one or any combination of Examples 93-94, can optionally include the second plurality of interlocking devices project from a surface of the second film, can optionally include the second plurality of interlocking devices have an extent in both the transverse direction and the longitudinal direction, and can optionally include at least some of the second plurality of interlocking devices are spaced apart from one another by a second gap when the second film is not subject to the applied bending force or is subject to the applied bending force below the predetermined magnitude in one or both of the transverse direction and the longitudinal direction, and can optionally include the at least some of the second plurality of interlocking features contact one another and/or the first plurality of features to arrest a curvature of the second film in one or both of the transverse direction and the longitudinal direction when the applied bending force is at or above the predetermined magnitude.

In Example 96, the apparatus of any one or any combination of Examples 93-95, can optionally include engagement of the first plurality of interlocking devices with the second plurality of interlocking devices is facilitated by an initial movement of the first film relative to the second film in one of the transverse direction and the longitudinal direction, and can optionally include disengagement of the first plurality of interlocking devices from the second plurality of interlocking devices is facilitated by a sequent movement of the first film relative to the second film in a same one of the transverse direction and the longitudinal direction.

In Example 97, the apparatus of any one or any combination of Examples 93-96, can optionally include the first plurality of interlocking devices and the second interlocking devices comprise engagement rails that form a sliding channel.

In Example 98, the apparatus of any one or any combination of Examples 82-97, further comprising an optical coupler disposed between the first film and the second film, can optionally include the optical coupler is a liquid, adhesive, gel, or a combination thereof.

In Example 99, the apparatus of Example 98, can optionally include the optical coupler has a refractive index having an absolute different less than or equal to 0.05 from a refractive index of the first plurality of curvature arresting features.

In Example 100, the apparatus of any one or any combination of Examples 82-99, can optionally include the apparatus comprises a part of an electronic device and/or a wearable device.

In Example 101, the apparatus of any one or any combination of Examples 82-100, can optionally include the first plurality of curvature arresting features configured to provide the apparatus with a first stiffness at a desired degree of curvature in one of the transverse direction and the longitudinal direction, while being configured to provide the apparatus with a second stiffness at the same desired degree of curvature in the other of the transverse direction and the longitudinal direction, and can optionally include the first stiffness differs from the second stiffness.

In Example 102, the apparatus of any one or any combination of Examples 82-101, can optionally include the first plurality of curvature arresting features are optically clear.

In Example 103, the apparatus of any one or any combination of Examples 82-102, can optionally include one or both of the first film and the second film comprises at least one of a single layer or a plurality of layers.

In Example 104, the apparatus of any one or any combination of Examples 82-103, can optionally include the second film comprises a rigid component.

In Example 105, the apparatus of any one or any combination of Examples 82-104, can optionally include the second film comprises a different material than the first film.

In Example 106, the apparatus of any one or any combination of Examples 82-105, can optionally include the first plurality of curvature arresting features are disposed on both a first major surface of the first film and a second major surface of the first film.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention can be determined with reference to the appended claims, along with the full scope of equivalents to which such claims are entitled.

Working Example 1

Figure 25:
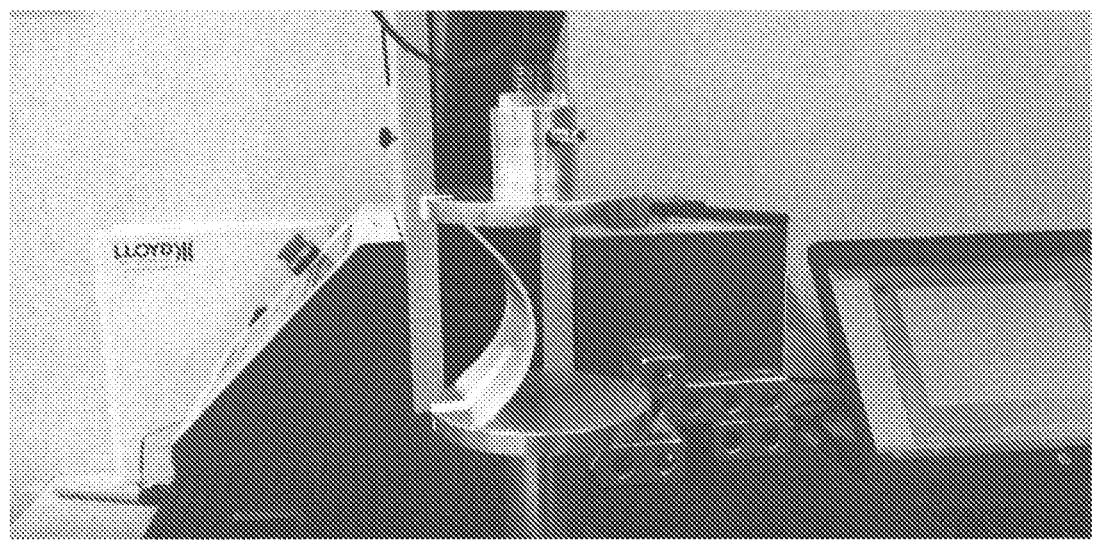
FIGS. 25 and 26 show test equipment performing a bending test according to Working Example 1.

The flexural stiffness of various apparatuses discussed herein including those utilizing curvature arresting features and/or interlocking devices (sometimes referred to generically as features in this disclosure) can be evaluated utilizing a common compression load frame with two flat plate interfaces. Stiffness is defined as the slope of an object's resistance to force over a finite extension or compression. The curvature arresting device can be placed between the plates in a slightly curved state to ensure the proper direction of curvature can be obtained and measured. A properly positioned apparatus will transmit all of the bending force to the load measurement device and can reside in the center of the plates, aligned with the load measurement device (typically an S-Beam load cell). FIG. 25 is an example of the initial test state.

Figure 26:
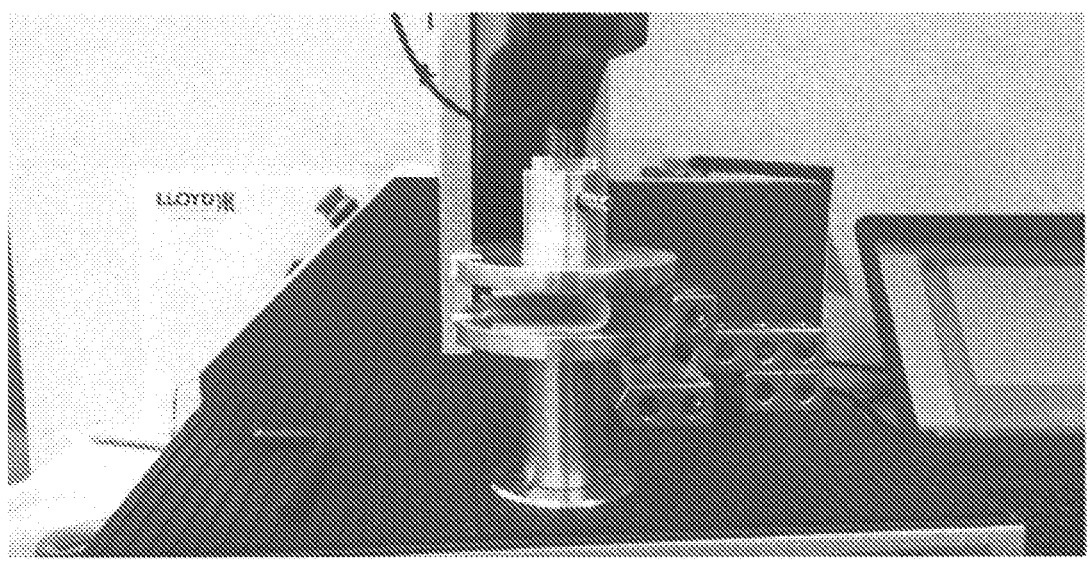

The force is then ramped at a linear rate of 12 in/min until a predefined compression limit is reached such as illustrated in FIG. 26. Once the desired displacement limit is reached, the plate returns to its home position and the force versus displacement response to flexural loading can be evaluated.

According to the Working Example 1, a procedure such as the type illustrated and described was performed utilizing a Lloyd Instruments LF plus 01/LFUS/LxA/45, available through AMETEK Inc. (Largo, Fla.). A 50 N load cell was utilized to measure the compression load on a flexural specimen. The specimen was placed, slightly flexed, between two flat plates and taped at each plate interface, using SCOTCH™ Brand masking tape to the two plates to prevent the specimen from falling out as shown in FIG. 25. The load frame applied a compressive displacement on each side of the specimen. The forces and displacements were recorded electronically. The experiment was repeated three times with the same specimen to ensure statistical accuracy.

Figure 24:
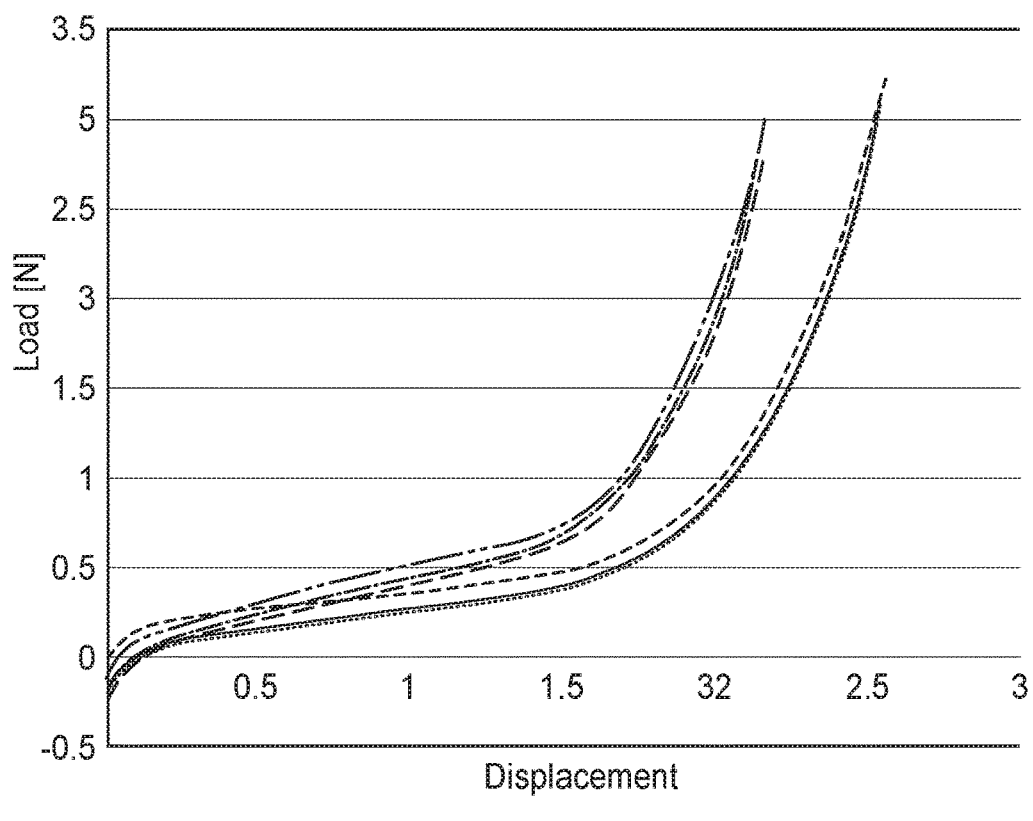
FIG. 24 shows a plot of applied load v. displacement for various apparatuses as is further described in Working Example 1.

In reference to FIG. 24, shows the results of the stiffness measurements for an apparatus with different curvature arresting features on either side of the apparatus being bent in a direction described previously in FIG. 6 as M1 (WS.A-1, WS.A-2, WS.A-3) and for a direction previously described as M2 (A-1, A-2, A-3). The response of the apparatus to bending moment M1 has a lower arresting displacement and proceeds towards infinite stiffness (zone III as described previously in reference to FIG. 23) at a much lower displacement than the response of the apparatus to the bending moment M2 (which does not have the curvature arresting features but rather interlocking devices of a segmented nature such as shown in FIGS. 11 and 12 configured to arrest curvature of the apparatus in this direction).

The total span of the curvature arresting features arresting bending moment M1 is approximately 6.3 mm with a height approximately 1.6 mm, a thickness of approximately 6.3 mm and an effective radius of approximately 16.3 mm.

The total span of the features arresting bending moment M2 is approximately 525 µm with a height approximately 294 µm, a thickness of approximately 139 µm and an effective radius of approximately 1.195 mm.

Put another way, FIG. 24 illustrates two measurement sets that are performed on the same sample but in different bending moment directions M1 and M2. The sample is configured to have curvature arresting features to arrest the bending when M1 is applied. The sample relies only on interlocking devices to arrest the bending when M2 is applied. These differences in the configuration of the sample in the longitudinal direction v. the transverse direction results in the different zone III transition values shown in FIG. 24.

According to one specific example, and in reference to the embodiment of FIG. 20, a 100 mm×40 mm apparatus was created using interlocking devices (also referred to simply as features in this disclosure) that act as curvature arresting features in one principle bending direction but are arrested prematurely by large form factor curvature arresting features in the opposite bending direction. The first film is a 200 µm 3M Vikuiti™ Anti-Reflection Cover Film available from 3M Company (St. Paul, Minn.). A 25 µm layer of 468MP™ Pressure Sensitive Adhesive (PSA) available from 3M Company (St. Paul, Minn.), was deposed on the first surface of the first film. Two strip of approximately 12 mm wide interlocked interlocking devices according to FIGS. 29 and 30 were adhered to the two principle edges of the first film and adhesive along the 100 mm side. This procedure is repeated two more times to create a stack, along the two 100 mm long principle edges of the first film and adhesive of four adhesive layers and three interlocked interlocking devices according to FIGS. 29 and 30. A total of 15, 6.3 mm wide, 1.6 mm tall curvature arresting features with a 10° angle were adhered to the 3M Vikuiti™ and adhesive approximately between the two strips of three sets of interlocking devices according to FIGS. 29 and 30. Two 12 mm strips of 468MP™ PSA, where laminated on the top of the final layer of interlocking devices according to FIGS. 29 and 30. A layer of 200 µm Vikuiti™ film, was adhered the two 12 mm strips of 468MP PSA. This construction demonstrates two radii of curvature being utilized within the same apparatus. This construction results in a stiffening radius of 1.195 mm on the interlocking devices as curvature arresting features side, and 16.3 mm on the interlocking features with additional curvature arresting feature side.

The ability for this apparatus to arrest curvature was demonstrated, not to failure, utilizing the procedure described previously. The procedure was performed utilizing a Lloyd Instruments LF plus 01/LFUS/LxA/45, available through AMETEK Inc. A 50 N load cell was utilized to measure the compression load on the flexural specimen. A total displacement of 65 mm was applied to the side that only relies on the interlocking features as curvature arresting features and a total of 55 mm of displacement was applied to evaluate the compression forces on the opposite side of the device as shown in FIG. 26. The forces and displacements were recorded electronically. The experiment was repeated three times with the same specimen to ensure statistical accuracy. As described previously, two different curvature arresting behaviors are present and are illustrated in FIG. 24 (as discussed previously). The onset of zone III, as previously described including in reference to FIG. 23, are approximately 10 mm of plate travel apart.

Working Example 2

Figure 27:
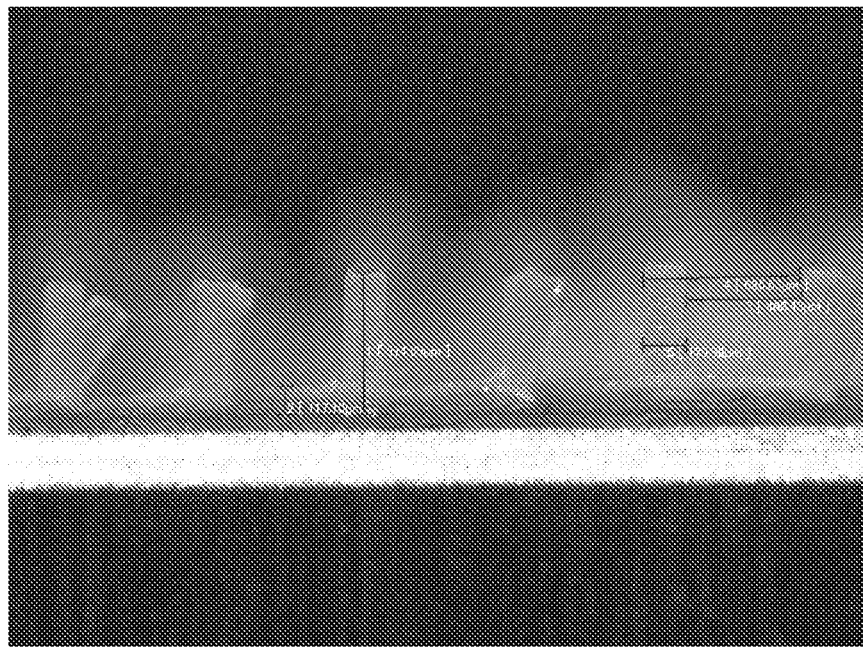
FIGS. 27-32 are images of various curvature arresting features some having different shapes along with dimensional measurements as is further described in Working Examples 2-4.
Figure 28:
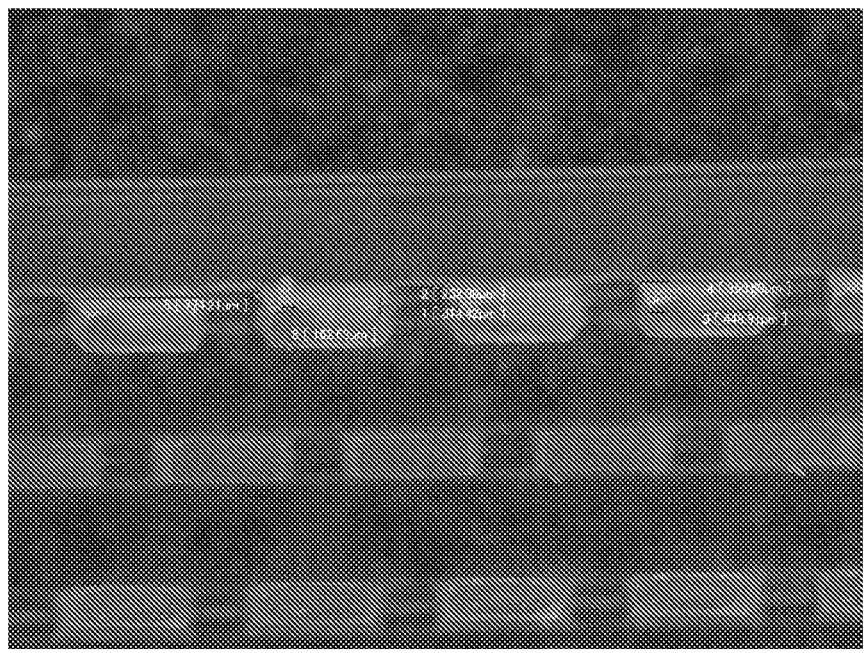

This example, shown in FIGS. 27 and 28, has curvature arresting features shaped as trapezoids disposed on a web in a line with a space between subsequent lines of trapezoids. As indicated in FIGS. 27 and 28, the total span of the trapezoids is approximately 774 µm with a height approximately 575 µm, a thickness of approximately 163 µm and an effective radius of approximately 0.84 mm. This example embodiment does not include a capped structure. The curvature arresting features are produced from a Dow 2027G Medium Density Polyethylene.

Working Example 3

Figure 29:
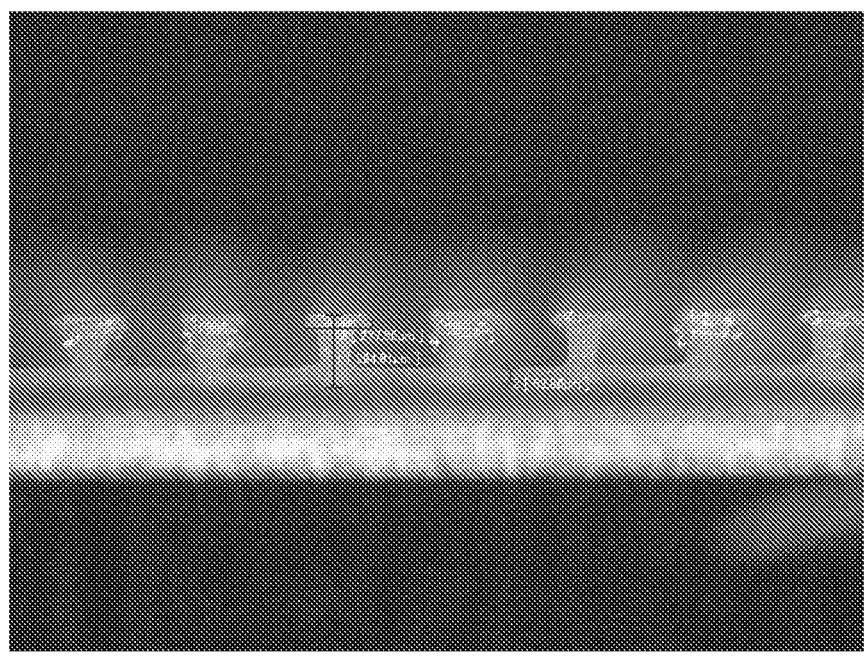
Figure 30:
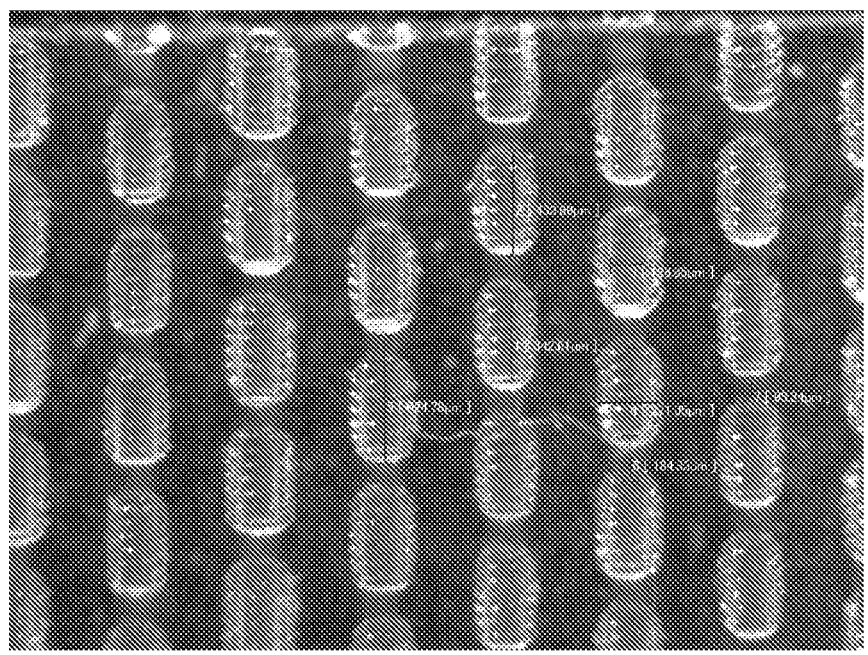

This example, shown in FIGS. 29 and 30, utilizes interlocking devices disposed on a web in a line with a space between subsequent lines of interlocking devices. The interlocking devices have undergone a capping process that created a cap that is wider than the stem. As shown in FIGS. 29 and 30, the total width of the interlocking devices is approximately 525 µm with a height approximately 294 µm, a stem thickness of approximately 139 µm, a cap thickness of 271 µm and an effective radius of approximately 1.195 mm. The interlocking devices are produced from a Dow 2027G Medium Density Polyethylene.

Working Example 4

Figure 31:
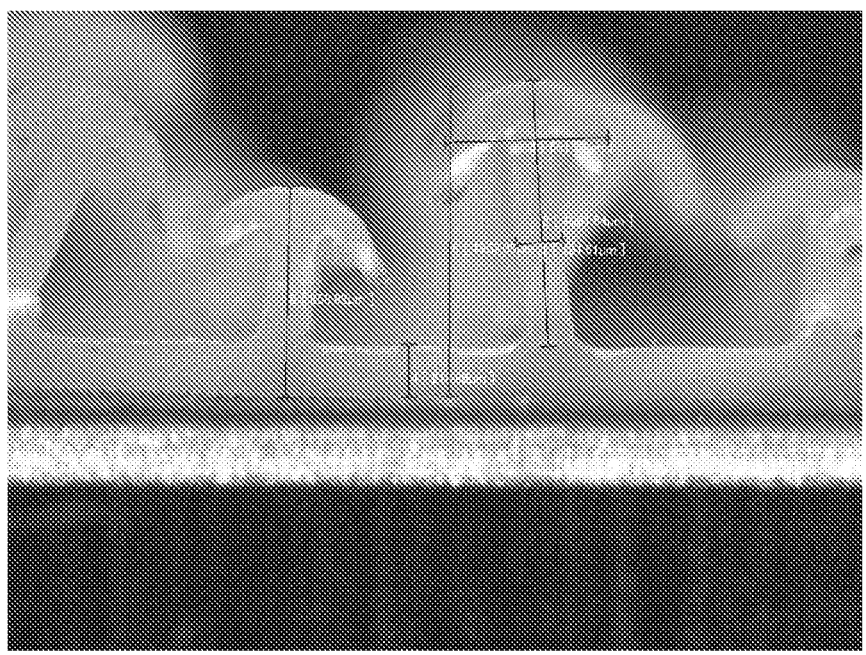
Figure 32:
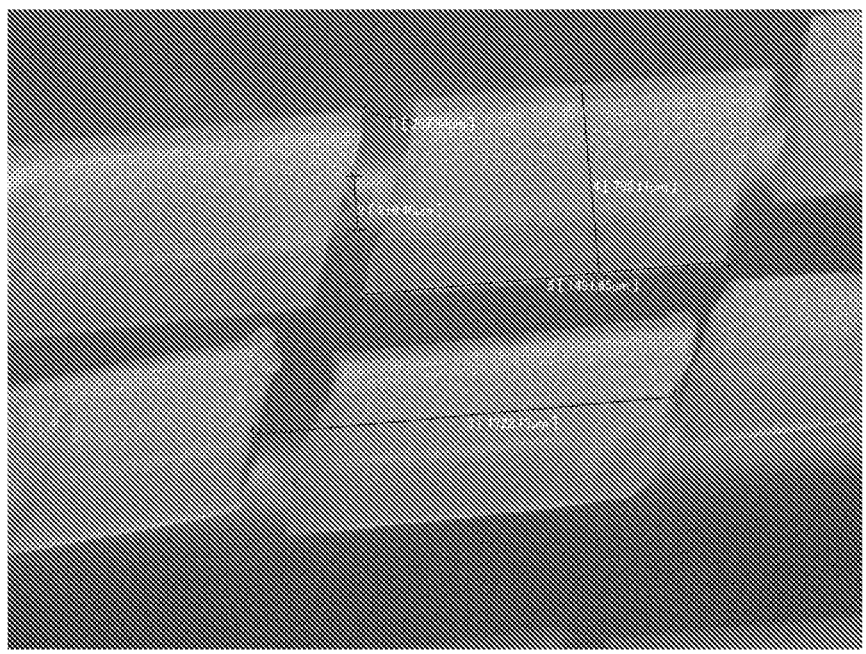

This example, shown in FIGS. 31 and 32, shows interlocking devices disposed on a web in a line with a space between subsequent lines of interlocking devices. The interlocking devices where created utilizing a profile extrusion process in a linear process. The interlocking devices were then physically cut to create a gap. As shown in FIGS. 31 and 32, the total width of the interlocking devices is approximately 1722 µm with a height approximately 1262 µm, a stem thickness of approximately 219 µm, a cap thickness of 795 µm and an effective radius of approximately 9.2 mm. The interlocking devices are produced from a Polypropylene.

Working Example 5

According to Working Example 5 and in reference to the embodiment of FIG. 7, a 100 mm×60 mm apparatus was created using interlocking devices (or described generically as features in FIGS. 13 and 14) that act as curvature arresting features in one principle bending direction but are arrested prematurely by large form factor curvature arresting features in the opposite bending direction. The first film is a 200 µm Lexan 121 Polycarbonate Sheet available from Sabic North America, (Houston, Tex.). A 25 µm layer of Optically Clear Adhesive CEF-38, available from 3M Company (St. Paul, Minn.)™, was deposed on the first surface of the first film. Two strip of approximately 12 mm wide interlocked interlocking devices according to the construction of FIGS. 31 and 32 were adhered to the two principle edges of the Lexan 121 Polycarbonate Sheet and adhesive along the 100 mm side. A total of 15, 6.4 mm wide, 2.2 mm tall curvature arresting features with a 5° angle were adhered to the Lexan 121 Polycarbonate Sheet and adhesive approximately between the two strips of interlocked interlocking devices according to the construction of FIGS. 31 and 32.

Two 12 mm strips of Optically Clear Adhesive CEF-38, available from 3M Company, were laminated on the second major surface of the interlocked interlocking devices according to the construction of FIGS. 31 and 32. Finally, another layer of 200 µm Lexan 121 Polycarbonate Sheet, available from Sabic, was adhered the two 12 mm strips of Optically Clear Adhesive. This construction demonstrates two radii of curvature being utilized within the same apparatus. This construction results in a stiffening radius of 9.2 mm on the interlocking devices as curvature arresting features side, and 34.4 mm on the interlocking devices with additional curvature arresting feature side.

What is claimed is:

1. An apparatus comprising:
a flexible first film having an extent in both a longitudinal direction and a transverse direction;
a second film at least partially interfacing the first film and having an extent in both the longitudinal and the transverse direction
a first plurality of curvature arresting features disposed between the first film and the second film, wherein the first plurality of curvature arresting features have an extent in both the transverse direction and the longitudinal direction and extend from a surface of the first film, and wherein at least some of the first plurality of curvature arresting features are spaced apart from one another by a gap when the first film is not subject to an applied bending force or is subject to the applied bending force below a predetermined magnitude in one or both of the transverse direction and the longitudinal direction, and wherein the at least some adjacent ones of the first plurality of curvature arresting features contact one another to arrest a curvature of the first film in one or both of the transverse direction and the longitudinal direction when the applied bending force is at or above the predetermined magnitude;
a first plurality of interlocking devices attached to or integral with the first film; and
a second plurality of interlocking devices attached to or integral with the second film;
wherein the first plurality of interlocking devices are configured to engage the second plurality of interlocking devices, and wherein when the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible
wherein at least one of the first plurality of interlocking devices or the second plurality of interlocking devices and the first plurality of curvature arresting features are optically clear.

2. The apparatus of claim 1, wherein the first and second interlocking devices comprise one or more of rails, channels, caps and stems.

3. The apparatus of claim 1, wherein the first plurality of curvature arresting features are arranged in a geometric pattern.

4. The apparatus of claim 1, wherein the gap comprises 0.050 mm to 10 mm, inclusive.

5. The apparatus of claim 1, wherein the gap has a first ratio to that of a width of one of first plurality of curvature arresting features between 0.1 and 10, inclusive, and wherein the gap has a second ratio to that of a thickness of the first plurality of curvature arresting features between 0.1 and 1, inclusive.

6. The apparatus of claim 1, wherein separation of the first film from the second film in a direction generally perpendicular to the surface of the first film is prevented by engagement of the first plurality of interlocking devices with the second plurality of interlocking devices.

7. The apparatus of claim 1, wherein at least some adjacent ones of the second plurality of interlocking devices have a second gap among one another when the second film is not subject to the applied bending force or is subject to the applied bending force below the predetermined magnitude in one or both of the transverse direction and the longitudinal direction, and wherein the at least some adjacent ones of the second plurality of interlocking features contact one another to arrest a curvature of the second film in one or both of the transverse direction and the longitudinal direction when the applied bending force is at or above the predetermined magnitude.

8. The apparatus of claim 1, further comprising a second plurality of curvature arresting features attached to or integrated with the second film, wherein the second plurality of curvature arresting features have an extent in both the transverse direction and the longitudinal direction, and wherein at least some adjacent ones of the second plurality of curvature arresting features have by a second gap among one another when the second film is not subject to an applied bending force or is subject to the applied bending force below a predetermined magnitude in one or both of the transverse direction and the longitudinal direction, and wherein the at least some adjacent ones of the second plurality of curvature arresting features contact one another and/or the first plurality of curvature arresting features to arrest a curvature of the first film in one or both of the transverse direction and the longitudinal direction when the applied bending force is at or above the predetermined magnitude.

9. The apparatus of claim 1, wherein engagement of the first plurality of interlocking devices with the second plurality of interlocking devices is facilitated by an initial movement of the first film relative to the second film in one of the transverse direction and the longitudinal direction, and wherein disengagement of the first plurality of interlocking devices from the second plurality of interlocking devices is facilitated by a sequent movement of the first film relative to the second film in a same one of the transverse direction and the longitudinal direction.

10. The apparatus claim 1, wherein the first plurality of interlocking devices and the second interlocking devices comprise engagement rails that form a sliding channel.

11. The apparatus of claim 1, further comprising an optical coupler disposed between the first film and the second film, wherein the optical coupler is a liquid, adhesive, gel, or a combination thereof.

12. The apparatus of claim 11, wherein the optical coupler has a refractive index having an absolute difference less than or equal to 0.05 from a refractive index of the first plurality of curvature arresting features.

13. The apparatus of claim 1, wherein the apparatus comprises a part of an electronic device.

14. The apparatus of claim 1, wherein the first plurality of curvature arresting features configured to provide the apparatus with a first stiffness at a desired degree of curvature in one of the transverse direction and the longitudinal direction, while being configured to provide the apparatus with a second stiffness at the same desired degree of curvature in the other of the transverse direction and the longitudinal direction, and wherein the first stiffness differs from the second stiffness.

15. The apparatus of claim 1, wherein the first plurality of curvature arresting features also form parts of the first plurality of interlocking devices.

16. An apparatus comprising:
a flexible first film having an extent in both a longitudinal direction and a transverse direction;
a second film at least partially interfacing the first film and having an extent in both the longitudinal and the transverse direction;
a first plurality of curvature arresting features disposed between the first film and the second film, wherein the first plurality of curvature arresting features have an extent in both the transverse direction and the longitudinal direction and extend from a surface of the first film, and wherein at least some of the first plurality of curvature arresting features are spaced apart from one another by a gap when the first film is not subject to an applied bending force or is subject to the applied bending force below a predetermined magnitude in one or both of the transverse direction and the longitudinal direction, and wherein the at least some adjacent ones of the first plurality of curvature arresting features contact one another to arrest a curvature of the first film in one or both of the transverse direction and the longitudinal direction when the applied bending force is at or above the predetermined magnitude;
a first plurality of interlocking devices attached to or integral with the first film;
a second plurality of interlocking devices attached to or integral with the second film; and
a coupling material, the coupling material having an overall refractive index that has an absolute difference less than or equal to 0.05 from a refractive index of at least one of the first plurality of interlocking devices or the second plurality of interlocking devices and the overall refractive index of the coupling material having an absolute difference less than or equal to 0.05 from a refractive index of the first plurality of curvature arresting features,
wherein first plurality of interlocking devices are configured to engage the second plurality of interlocking devices, and wherein when the first plurality of interlocking devices engage the second plurality of interlocking devices, movement of the first film from the second film in one of the transverse direction and the longitudinal direction is prevented while movement of the first film relative to the second film in the other of the transverse direction and the longitudinal direction is possible.

* * * * *